United States Patent
Hage et al.

(10) Patent No.: US 10,713,613 B2
(45) Date of Patent: Jul. 14, 2020

(54) REDUNDANT WIRELESS ELECTRONIC MOTOR VEHICLE CHASSIS MONITORING NETWORK

(71) Applicants: Joseph Hage, La Canada, CA (US); Pierre Touma, Austin, TX (US); Elias Bachaalany, Halat (LB); Imad Maalouf, El Metn (LB)

(72) Inventors: Joseph Hage, La Canada, CA (US); Pierre Touma, Austin, TX (US); Elias Bachaalany, Halat (LB); Imad Maalouf, El Metn (LB)

( * ) Notice: Subject to any disclaimer, the term of this patent is extended or adjusted under 35 U.S.C. 154(b) by 0 days.

(21) Appl. No.: 16/271,825

(22) Filed: Feb. 9, 2019

(65) Prior Publication Data

US 2019/0172008 A1    Jun. 6, 2019

Related U.S. Application Data

(63) Continuation-in-part of application No. 15/942,559, filed on Apr. 1, 2018, now Pat. No. 10,267,061.
(Continued)

(51) Int. Cl.
*G06F 19/00* (2018.01)
*G06Q 10/08* (2012.01)
(Continued)

(52) U.S. Cl.
CPC ....... *G06Q 10/0833* (2013.01); *E05B 39/005* (2013.01); *E05B 45/08* (2013.01);
(Continued)

(58) Field of Classification Search
CPC .... G01S 19/16; G01S 13/878; G06Q 10/0833
(Continued)

(56) References Cited

U.S. PATENT DOCUMENTS 6,167,347 A    12/2000  Lin
6,259,475 B1    7/2001  Ramachandran et al.
(Continued)

FOREIGN PATENT DOCUMENTS

EP    2421091    2/2012

OTHER PUBLICATIONS

"Tracking Device Hides in a Tail Lamp"; Oct. 26, 2016; anytrek.com 2 pages (Year: 2016).*
(Continued)

*Primary Examiner* — Shannon S Campbell
*Assistant Examiner* — Freda A Nelson

(57) ABSTRACT

A freight tracking system uses a tracking device hidden in the taillight of a vehicle and a remote device located somewhere else on the vehicle. The remote device determines the position of the vehicle using information received from global navigation system satellites and communicates this wirelessly to the tracking device using a mesh network. The tracking device comprises a 9-axis IMU (inertial measurement unit) that uses a fusion filter and a calculation involving digital quaternions to determine inertial information. The vehicle position is compared to geographic boundary information to determine if the vehicle might have gone outside of geographic boundaries. If so, a geofencing alarm is triggered. The device has a tampering detector to ensure that the device is not opened. The alarms, vehicle position, and time information can be communicated to an internet-connected database using a cellular wireless device.

20 Claims, 23 Drawing Sheets

Related U.S. Application Data

(60) Provisional application No. 62/480,963, filed on Apr. 3, 2017.

(51) Int. Cl.
  *G08B 29/04* (2006.01)
  *E05B 45/08* (2006.01)
  *G01S 19/47* (2010.01)
  *G01D 5/14* (2006.01)
  *G01R 33/02* (2006.01)
  *G01D 21/02* (2006.01)
  *E05B 39/00* (2006.01)

(52) U.S. Cl.
  CPC ............. *G01D 5/145* (2013.01); *G01D 21/02* (2013.01); *G01R 33/0206* (2013.01); *G01S 19/47* (2013.01); *G08B 29/046* (2013.01)

(58) Field of Classification Search
  USPC ...................... 342/25 B; 705/333; 455/67.12
  See application file for complete search history.

(56) References Cited

U.S. PATENT DOCUMENTS

| | | | |
|---|---|---|---|
| 6,665,613 B2 | 12/2003 | Duval | |
| 6,747,558 B1 | 6/2004 | Thorne et al. | |
| 6,753,775 B2 | 6/2004 | Auerbach et al. | |
| 7,148,850 B2 | 12/2006 | Puente Baliarda et al. | |
| 7,202,822 B2 | 4/2007 | Baliarda et al. | |
| 7,411,495 B2 | 8/2008 | Auerbach et al. | |
| 7,519,463 B2 | 4/2009 | Olsen, III et al. | |
| 7,916,016 B2 | 3/2011 | Auerbach et al. | |
| 8,031,114 B2 | 10/2011 | Kellermeier et al. | |
| 8,138,917 B2 | 3/2012 | Diener et al. | |
| 8,140,265 B2 | 3/2012 | Grush | |
| 8,203,451 B2 | 6/2012 | Evans et al. | |
| 8,378,813 B2 | 2/2013 | Bannard | |
| 8,752,988 B2* | 6/2014 | Tomio .................. | H01Q 1/3291 362/485 |
| 8,810,454 B2 | 8/2014 | Cosman | |
| 8,909,248 B2 | 12/2014 | Phillips et al. | |
| 8,949,022 B1* | 2/2015 | Fahrner ................. | G01C 21/00 340/995.19 |
| 8,957,812 B1* | 2/2015 | Hill ....................... | G01S 5/0027 342/445 |
| 9,013,306 B2 | 4/2015 | Koh et al. | |
| 9,177,282 B2 | 11/2015 | Stevens et al. | |
| 9,247,384 B2 | 1/2016 | Junkar et al. | |
| 9,339,224 B2 | 5/2016 | Borkholder et al. | |
| 9,349,104 B2 | 5/2016 | O'Neill et al. | |
| 9,363,636 B2 | 6/2016 | Ganesh et al. | |
| 9,369,840 B2 | 6/2016 | Alsina et al. | |
| 9,426,620 B2 | 8/2016 | Xu et al. | |
| 9,430,781 B1 | 8/2016 | Kerr et al. | |
| 9,432,068 B2 | 8/2016 | Stahlin | |
| 9,451,402 B2 | 9/2016 | Srivastava et al. | |
| 9,538,329 B1 | 1/2017 | Vivathana | |
| 9,835,728 B1* | 12/2017 | Zeng ....................... | G01S 19/16 |
| 9,900,669 B2 | 2/2018 | Touma et al. | |
| 2005/0134457 A1 | 6/2005 | Rajapakse et al. | |
| 2005/0136912 A1* | 6/2005 | Curatolo ............... | G01S 5/0036 455/423 |
| 2005/0179545 A1 | 8/2005 | Bergman et al. | |
| 2006/0017551 A1* | 1/2006 | Neher .................... | B60R 25/04 340/426.19 |
| 2007/0118286 A1* | 5/2007 | Wang ..................... | G01S 19/21 342/357.59 |
| 2007/0262861 A1* | 11/2007 | Anderson ............ | G06Q 10/025 340/539.13 |
| 2009/0066503 A1 | 3/2009 | Lin | |
| 2010/0019927 A1* | 1/2010 | Cirker .............. | G08B 13/19686 340/426.19 |
| 2011/0267222 A1* | 11/2011 | Craig ................... | G01S 13/878 342/25 B |
| 2012/0144885 A1 | 6/2012 | Mills | |
| 2013/0069776 A1 | 3/2013 | Haber | |
| 2015/0371511 A1 | 12/2015 | Miller et al. | |
| 2016/0049014 A1 | 2/2016 | Wells et al. | |
| 2016/0204499 A1* | 7/2016 | Toh ......................... | H01Q 1/24 343/702 |
| 2016/0353239 A1 | 12/2016 | Kjellsson et al. | |
| 2018/0231664 A1 | 8/2018 | Zeng | |
| 2019/0045325 A1* | 2/2019 | Kumar ................... | G08B 25/10 |

OTHER PUBLICATIONS

"Anytrek Introduces TrackLight GPS Tracker"; Mar. 20, 2017; fleetequipmentmag.com; 2pgs (Year: 2017).*

Web page from Mul-T-Lock Website. Source: https://www.mul-t-lock.com/en/site/mul-t-lock/products/padlocks/c-series-padlocks/c-series-padlock-single-pin-/. Downloaded on Apr. 1, 2018.

Datasheet on C-Series Padlock Single Pin that shows table of dimensions and order options.

Datasheet for Hi-G-Tek Lock.

* cited by examiner

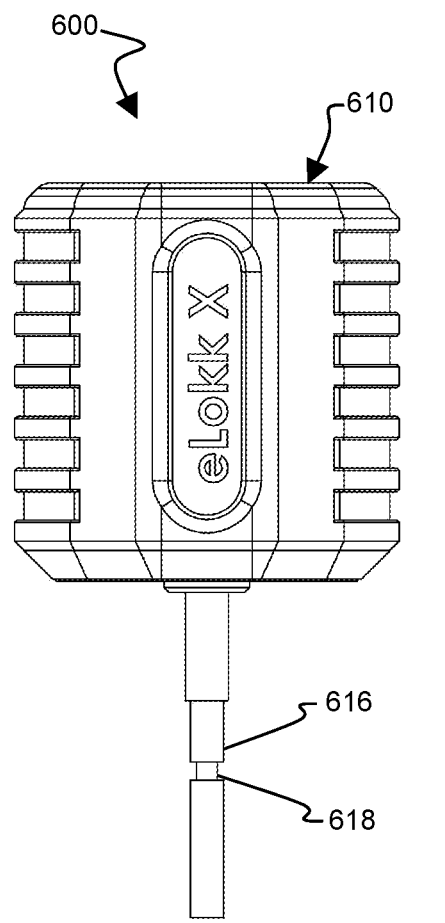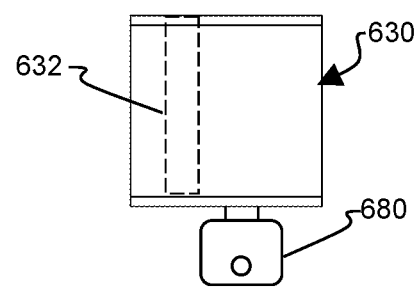
FIG. 11

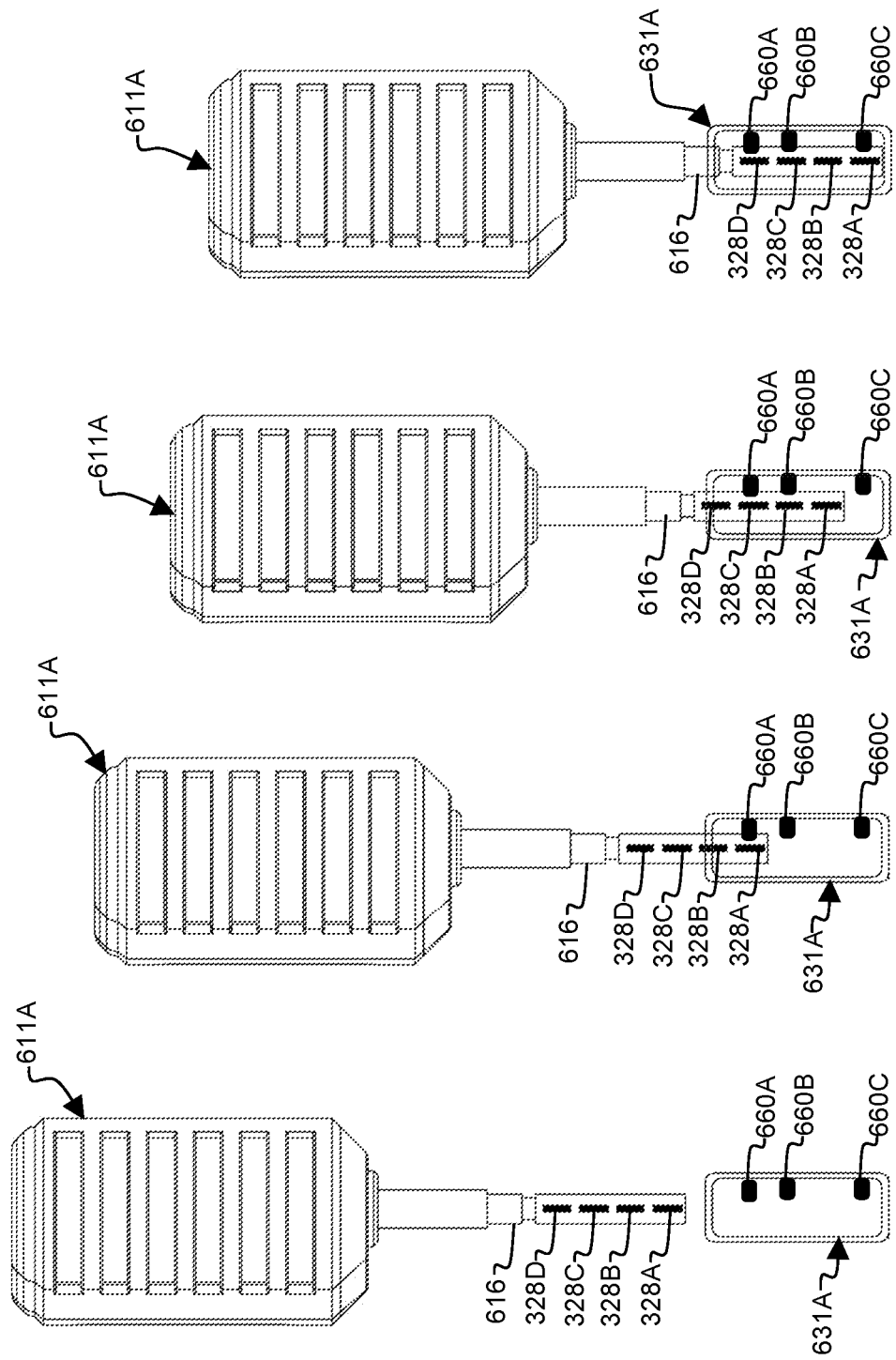

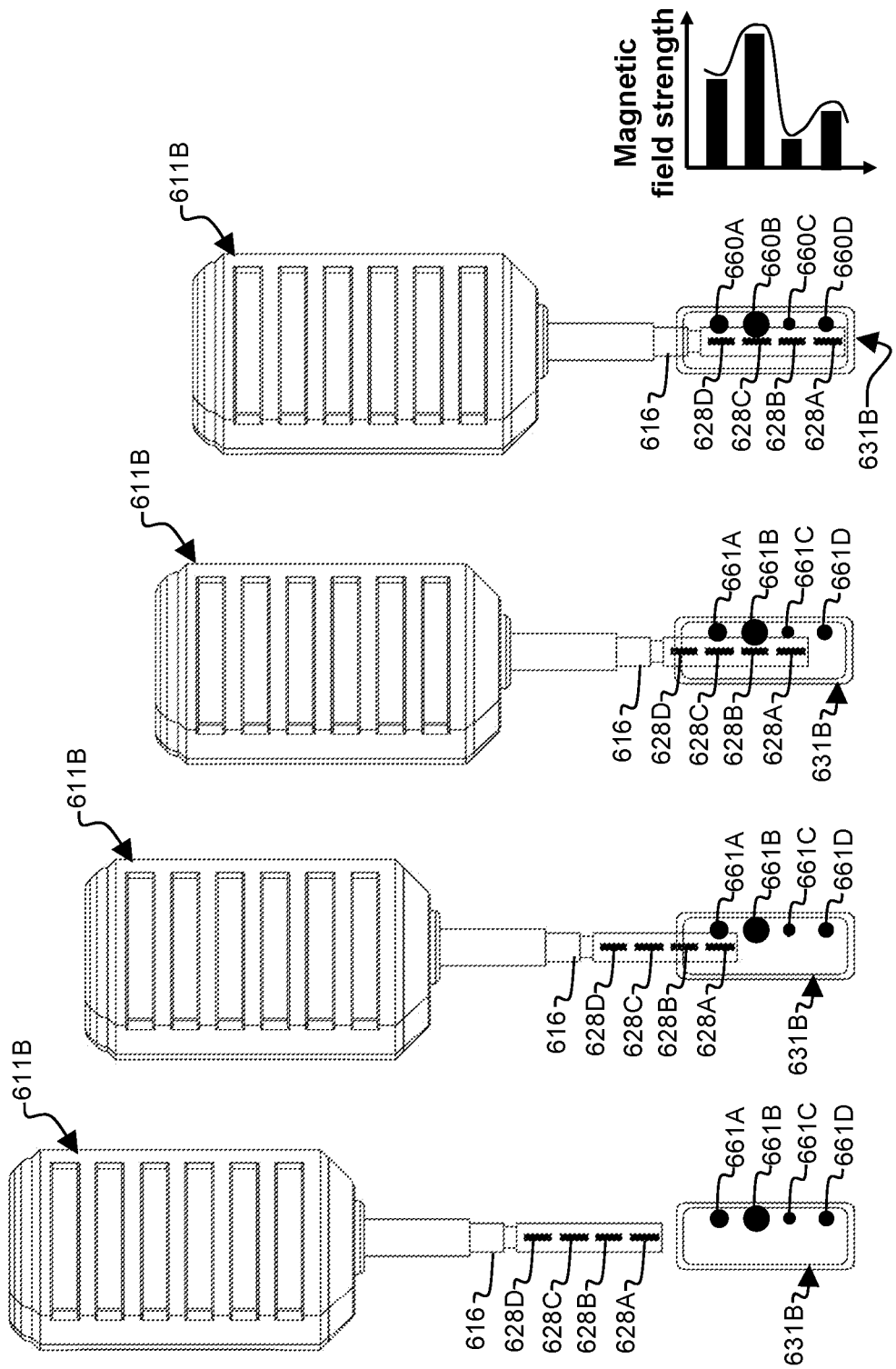

REDUNDANT WIRELESS ELECTRONIC MOTOR VEHICLE CHASSIS MONITORING NETWORK

CROSS REFERENCE TO RELATED APPLICATIONS

This application is a continuation in part of U.S. patent application Ser. No. 15/942,559 filed 1 Apr. 2018, which claims benefit of U.S. Provisional Patent Application Ser. No. 62/480,983, filed 3 Apr. 2017, the entire disclosures of which are incorporated by reference herein.

BACKGROUND

Embodiments of the present invention relate to systems and methods for electronic monitoring of a motor vehicle chassis and/or movable freight container. This monitoring can comprise location tracking, tamper detection, environmental monitoring, redundant mesh networks, redundant devices, and communication with locks and vehicle sensor systems.

The US Federal Bureau Investigation reported that in 2015 over $30B per year of cargo was lost in the USA due to theft. Theft rates can be even higher in other countries. Historically, the best solution was to lock the cargo as well as possible. For additional security, it is desired to use wireless communication technologies, Global Navigation Satellite Systems (GNSS), and the Internet of Things (IoT) to track cargo location and history. This can also provide information about the location and history of a cargo.

The following is a list of desirable features for an electronic tracking, monitoring, and/or locking system or method for a vehicle chassis and/or movable freight container:

(a) The system and/or method should be as reliable as possible. For example, it should work consistently in a typical freight container environment, including exposure to a broad temperature range, moisture, humidity, shock, vibration, dirt, chemicals, and pollution.
(b) The system and/or method should report and/or record environmental exposure by, for example, recording parameters such as temperature and vibration.
(c) The system and/or method should be configured to operate for long time periods without recharging. Low power consumption, sufficient battery storage, and the capability of harvesting power while in use can be features for accomplishing this goal.
(d) The system and/or method should be tamperproof. If tampered with, the system should immediately communicate an alarm, as well as system location at the time of tampering.
(e) To reduce the possibility of tampering, the system and/or method should be hidden, or be small and/or unobvious.
(f) The system and/or method should track location and communicate location information back to a "base" on a regular basis.
(g) The system or method should transmit alarms when an abnormal condition occurs, such as being outside of a geographical boundary, failure or tampering with any component, loss of communication with a fixed asset, and/or any other out of normal condition identified.
(h) The system and/or method needs to be affordable, easy to manufacture, and easy to maintain.
(i) The system and/or method should integrate with industry standard communications technologies and protocols.
(j) The system and/or method should be configured to be used anywhere in the world.
(k) The system and/or method should have multi-level communication capability with other similar systems and other vehicle systems and smart devices carried by mobile individuals, in addition to being IoT enabled.
(l) The system and/or method could incorporate optical, electro-optical and radar sensors such as cameras, lidars and radars.

BRIEF DESCRIPTION OF THE DRAWINGS

For a more complete understanding of the present invention and the advantages thereof, reference is made to the following description taken in conjunction with the accompanying drawings in which like reference numerals indicate like features and wherein:

FIG. 11 is an exploded view of FIG. 10B with the mechanical lock module detached from the electronic module and a key inserted into the mechanical lock module;

FIG. 10C; and FIG. 11;

FIG. 15A an end schematic view of an alternate embodiment lock module having three magnets and an alternate embodiment electronic module having four sensors with the shaft not inserted into the lock module;

FIG. 15B shows the lock module and electronic module of FIG. 15A with a portion of the alternate embodiment shaft is partly inserted into the cavity at a position where the top magnet in the lock module is detected by the bottom magnetic sensor in the alternate embodiment shaft;

FIG. 15C shows the lock module and electronic module of FIG. 15A with the alternate embodiment shaft portion inserted into the cavity at a position where the top magnet in the lock module is detected by the second from the top magnetic sensor in the shaft;

FIG. 15D shows the lock module and electronic module of FIG. 15A when the alternate embodiment shaft portion is fully inserted;

FIG. 16A is a second alternate embodiment lock module having four magnets of different field strengths and a second alternate embodiment of the electronic module having four sensors configured to convert detected magnetic field strengths to analog electrical values;

FIG. 16B shows the lock module and electronic module of FIG. 16A with the shaft partly inserted to a position where the top magnet is detected by the bottom sensor in the shaft;

FIG. 16C shows the lock module and electronic module of FIG. 16B with the shaft further inserted to a position where the top magnet is detected by the second from the top sensor in the shaft;

FIG. 16D shows the lock module and electronic module of FIG. 16A with the shaft fully inserted;

FIG. 16E shows a graph of the magnetic field strength of the four magnets in FIG. 16D that is detected by the four sensors in FIG. 16D;

Figure 1:
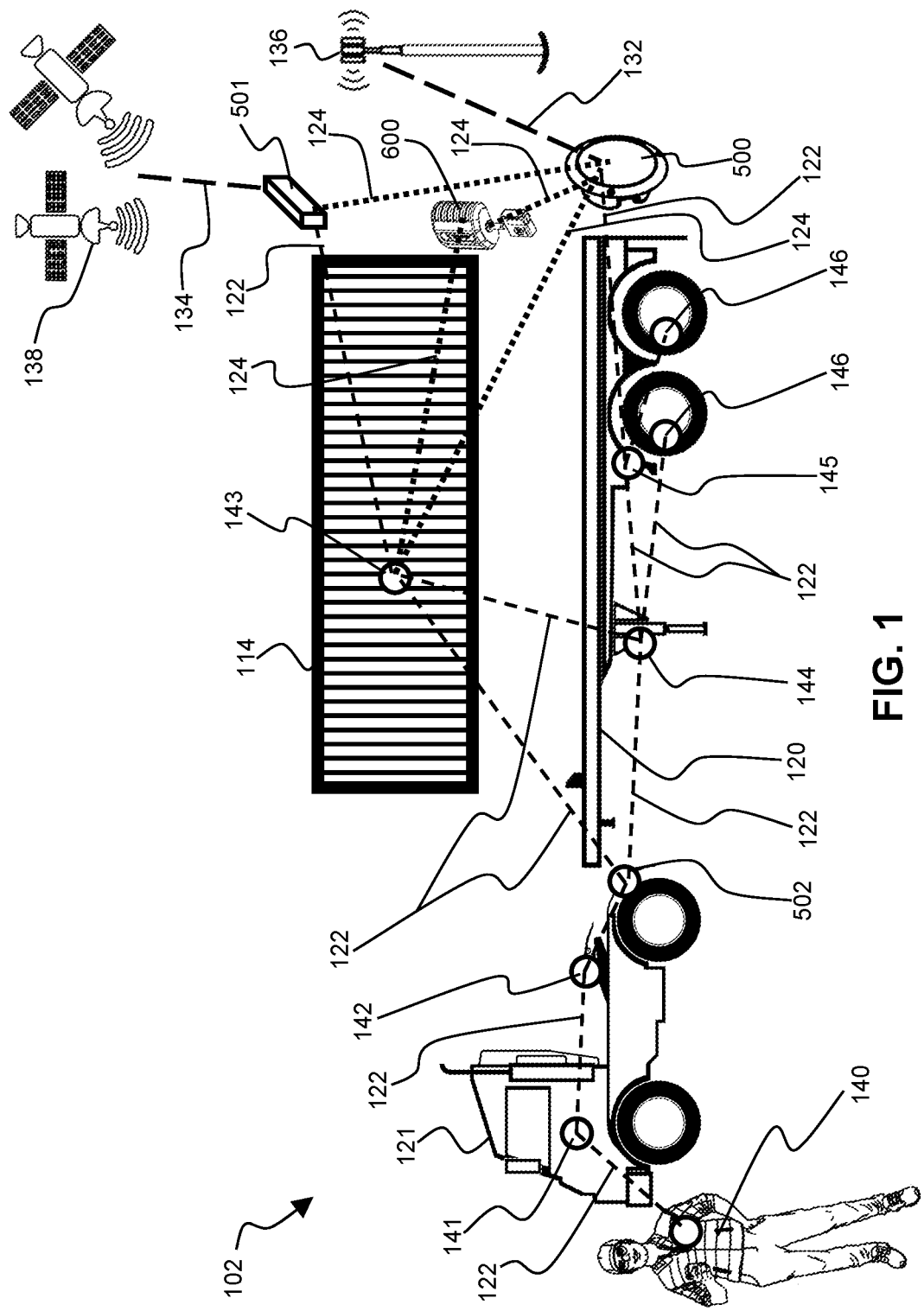
FIG. 1 shows a redundant wireless electronic motor vehicle chassis monitoring network comprising a plurality of wireless networked devices including at least one electronic lock and at least one wireless tracking device hidden in a light fixture.

It should be understood that the drawings are not necessarily to scale. In certain instances, details that are not necessary for an understanding of the invention or that render other details difficult to perceive may have been omitted. It should be understood that the invention is not necessarily limited to the particular embodiments illustrated herein.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment.

It should be understood that various changes could be made in the function and arrangement of elements without departing from the spirit and scope as set forth in the appended claims. Preferred embodiments of the present invention are illustrated in the Figures, with like numerals being used to refer to like and corresponding parts of the various drawings. Specific details are given in the following description to provide a thorough understanding of the embodiments. However, it will be understood by one of ordinary skill in the art that the embodiments may be practiced without these specific details.

1. Definitions

For purposes of describing embodiments of the present invention and claims, a movable freight container (hereinafter a "container") is defined as any storage unit configured to be filled with cargo, closed, and transported. Examples of movable freight containers include, but are not limited to, a sealable delivery truck cargo compartment, a motor vehicle freight trailer, an intermodal freight container, a railway wagon, and a unit load device for air freight. Typically, movable freight containers are sealed. They are often locked.

For purposes of describing embodiments of the present invention and claims, an electronic tracking and monitoring module (hereinafter also called a "tracking module") is defined as an electronic module: (a) comprising sensors; (b) configured to determine position; and (c) configured to communicate position information. Such a tracking module could be part of a vehicle tail light. Such a tracking module could be part of a lock. Such a tracking module could be part of any other device that is used with a container and has the functionality described herein.

For purposes of describing embodiments of the present invention and claims, a fusion filter is defined as an electronic and/or arithmetic process that compares actual and predicted angle and/or position information from multiple sensors to reach a more accurate measurement than could be obtained from using a single sensor and a single position measurement. Examples of fusion filters include Kalman filters, Madgwick filters, and Mahoney filters as will be further described further in this document.

2. Overview of One Embodiment of the System and Method

FIG. 1 illustrates one embodiment of the present invention as a system and method for a redundant wireless electronic motor vehicle chassis monitoring network. This system/method can comprise some or all of the following elements and functionality:

(a) The system and/or method can comprise one or more light fixtures. These light fixtures can further comprise a tracking module and a communication module, as well and other functionalities described herein. The light fixture or fixtures could be tail light systems, marker light systems, or other systems that include a light source.
(b) The system and/or method can comprise one or more locks and the lock or locks could comprise the tracking module as well as other functionalities described herein.
(c) Elements of the system/method could be configured for determining position by using a global navigation satellite system (GNSS). Examples of GNSS include the global positioning system (GPS) and any other space-based radio-navigation system such as the European Galileo, the Chinese BeiDou-2, or the Russian GLONASS system.
(d) Elements of the system/method could be configured for determining position by using information gathered from radio transmissions sent to or received from terrestrial-based transmitters in known locations.
(e) Elements of the system/method could be configured for determining position by using "dead reckoning" from a known position. This "dead reckoning could be used when updated position information from satellites, terrestrial-based radio transmission, or other sources of location information are not available or cannot be trusted. This "dead reckoning" could use velocity (direction and speed) and/or acceleration information in conjunction with time information to determine a new location from a known previous location.
(f) Elements of the system/method could use a Kalman filter, a Madgwick filter, a Mahoney filter, and/or any similar digital electronic motion information filter and/or fusion system or method in conjunction with an IMU (inertial measurement unit) for measuring acceleration, velocity, position, orientation, rate of change of orientation, or similar information. This processed information from the IMU could be used for "dead reckoning" of a position.
(g) The digital electronic motion information filter could use quaternions and/or Euler angles to make its determination of acceleration, velocity, position, orientation, rate of change orientation, and or similar. The quaternion and/or Euler angle methods could be used for "dead reckoning" of a position.
(h) Elements of the system/method could measure and record temperature, humidity, and/or other environmental parameters in addition to other information described herein.
(i) Elements of the system/method could maintain a log of sensed information such as location information, orientation information, temperature information, humidity information, shock information, and/or vibration information.
(j) Elements of the system/method could sense high G-force (high acceleration) impacts and determine their magnitudes and such high G-force impacts could include accelerations up to 500× the acceleration of gravity.
(k) Elements of the system/method could incorporate dual-SIM (subscriber identify module) functionality that allows the embodiments to communicate over more than one cellular communication network for redundancy purposes.
(l) Elements of the system/method could incorporate IoT (internet of things) communication technology such as Bluetooth Low Energy, ZigBee, XBee, 6LoWPAN, Z-Wave, IoT over near field communications, Sigfox, Neul, and/or LoRa. This IoT technology could use the Message Queuing Telemetry Transport (MQTT) protocol.
(m) Elements of the system/method could incorporate ultra-high bandwidth communication capability to other devices in radio range and this ultra-high bandwidth wireless transmission can be performed in a mesh fashion using multiple input multiple output (MIMO) antennas, wherein the ultra-high bandwidth can comprise operation in wavelengths of between 0.1 millimeter and 10 millimeters and the ultra-high bandwidth could use bandwidths in excess of 500 Mhz to send data at rates exceeding 1 gigabit per second. This ultra-high bandwidth communication could use pulses having a length of less than 60 cm or even less than 30 cm in some cases which minimizes fading and/or noise caused by signal reflections that overlap the original pulse. The system can also use coding techniques to reduce the impact of degradation caused by multi-path propagation and inter-pulse interference.
(n) Elements of the system/method could use a power-saving sleep mode for the main processor and could comprise another processor to wake up the sleeping processor.
(o) Elements of the system/method could incorporate vibration energy harvesting and such vibration energy harvesting can comprise a piezoelectric movement energy harvesting element.
(p) Elements of the system/method could incorporate truck-to-truck communication, tractor-truck-to-cargo-trailer communication, and truck-to-fixed-asset communication. Truck-to-fixed-asset communication means communication between a mobile freight container or a truck and readers on high passage gates (including optical character recognition gates) at ports, borders, and container yards, as well as readers that could be placed on telecommunications towers or power distribution poles. Such truck-to-truck, tractor-truck-to-cargo-trailer, and truck-to-fixed-assets communication could help extend the range of the communications system through mesh connectivity and could enable real-time logistics optimization, safer driving, and system tracking when satellite-based positioning (such as GPS) and/or terrestrial radio transmission positioning information is unavailable. This could beneficial in vehicles with autonomous capability including platoons of autonomously driven cargo trucks.
(q) Elements of the system/method could incorporate optical, electro-optical, radio frequency, and microwave sensors. These sensors would complement the communication with other trucks, vehicles and individual smart devices for safer driving, position localization and cargo security.
(r) Elements of the system/method could incorporate geofencing capabilities. This geofencing could use GNSS information to create a virtual geographic boundary for the device. An alarm could be triggered when the device enters or leaves a designated geofenced area. An alarm could be generated if communication between the device and a fixed physical asset is lost.
(s) The system/method could comprise redundant elements providing any of the herein described functions, including but not limited to, communication functions, so that the system could continue to operate reliably even when one or more components fail or are tampered with.

Describing FIG. 1 in more detail, a redundant electronic motor vehicle chassis monitoring network (vehicle monitoring network) is shown at 102. The vehicle monitoring network illustrated in FIG. 1 is configured for intra-vehicle communication using a plurality of communication connections shown as dotted lines. Some of these intra-vehicle communication connections could be CAN bus 1 or CAN bus 2 or similar communication connections 122. As used in this document, CAN stands for the controller area network that is typically used in vehicles and is documented in International Standards Organization (ISO) standard 11898 and related standards. In addition to the CAN bus, these intra-vehicle communication connections 122 could use any other communication method or protocol described herein or capable of being understood by anyone skilled in the art. FIG. 1 shows examples of these intra-vehicle communication connections 122 connecting a plurality of sensor and/or communication nodes that can include:

(a) User-wearable nodes, such as the vehicle driver identification, sensor, and/or communication node shown at 140;
(b) Nodes mounted on a motor vehicle tractor 121, such as the motor vehicle tractor identification, sensor and/or communication node shown at 141, the fifth-wheel sensor and/or communication node shown at 142, and the motor vehicle tractor taillight sensor and/or communication node shown at 502;
(c) Nodes mounted on a movable freight container 114, such as the movable freight container sensor and/or communication node shown at 143, and the electronic tracking and/or monitoring device hidden in a marker light shown at 501 (which can also be called a smart remote GPS antenna); and/or
(d) Nodes mounted on a freight vehicle trailer 120, such as the freight vehicle landing gear sensor and/or communication node shown at 144, the freight vehicle braking system sensor and/or communication node shown at 145, the tire sensor and/or communication nodes shown at 146; and/or the electronic tracking and/or monitoring device hidden in a vehicle tail light shown at 500. For example, having a connection to the tire sensor and/or communication node would allow monitoring of tire pressure and detection of tire theft.

The vehicle monitoring network 102 shown in FIG. 1 also comprises wireless mesh network communication connections shown at 124. The wireless mesh network communication connections 124 can be used between any of the nodes previously identified for the intra-vehicle communication connections shown at 122 (which are typically, but not always wired connections), and vice-versa, the intra-vehicle communication connections 122 can substitute for the wireless mech network communication connections 124 shown in FIG. 1. It is also possible for there to be both wireless mesh network communication connections 124 and intra-vehicle communication connections 122 between the same pair of nodes. In FIG. 1, the wireless mesh network communication connections 124 are shown between the following nodes:

(a) The movable freight container sensor and/or communication node 143 and an electronic tracking and monitoring lock 600;
(b) The movable freight container sensor and/or communication node 143 and the electronic tracking and or monitoring device hidden in a vehicle taillight 500;
(c) The movable freight container sensor and/or communication node 143 and the electronic tracking/monitoring device hidden in the marker light 501 (smart remote GPS antenna); and
(d) The electronic tracking and or monitoring device hidden in a vehicle taillight 500 and the electronic tracking device hidden in the marker light 501 (smart remote GPS antenna).

The vehicle monitoring network 102 shown in FIG. 1 further shows, at 134, a communication connection between the electronic tracking device in the marker light 501 (smart remote GPS antenna) and positioning satellites 138. Additionally, the vehicle monitoring network 102 shown in FIG. 1 shows, at 132, a communication connection between the electronic tracking/monitoring device in the vehicle taillight 500 and a cellphone communication tower 136. Regarding FIG. 1, it should be noted that:

(a) Embodiments of the present invention can incorporate any combination of the above attributes in any combination and configuration capable of being understood by anyone skilled in the art.
(b) The interface between the intra-vehicle (CAN bus) and the wireless mech network could be made using a bridge device that connects to an OBD (on-board diagnostics) connector typically found in motor vehicles. This bridge device could use power available at the OBD connector to convert CAN bus protocols to a wireless mesh protocols and vice-versa.
(c) The intra-vehicle connections 122 and wireless mesh network connections 124 could be used to communicate between any of the aforementioned nodes and any other node in the network and that such connections can be redundant connections as will be further described herein with reference to FIG. 6.
(d) The systems and methods described herein are not limited to the sensors and/or communication nodes illustrated in FIG. 1, but can include any sensors and/or communication variety of sensors and/or communication nodes capable of being understood by anyone skilled in the art including, but not limited to fuel tank level sensors, oil pressure sensors, load sensors, vehicle speedometers, etc.

3. Further Description of Embodiments and Variations

Figure 2A:
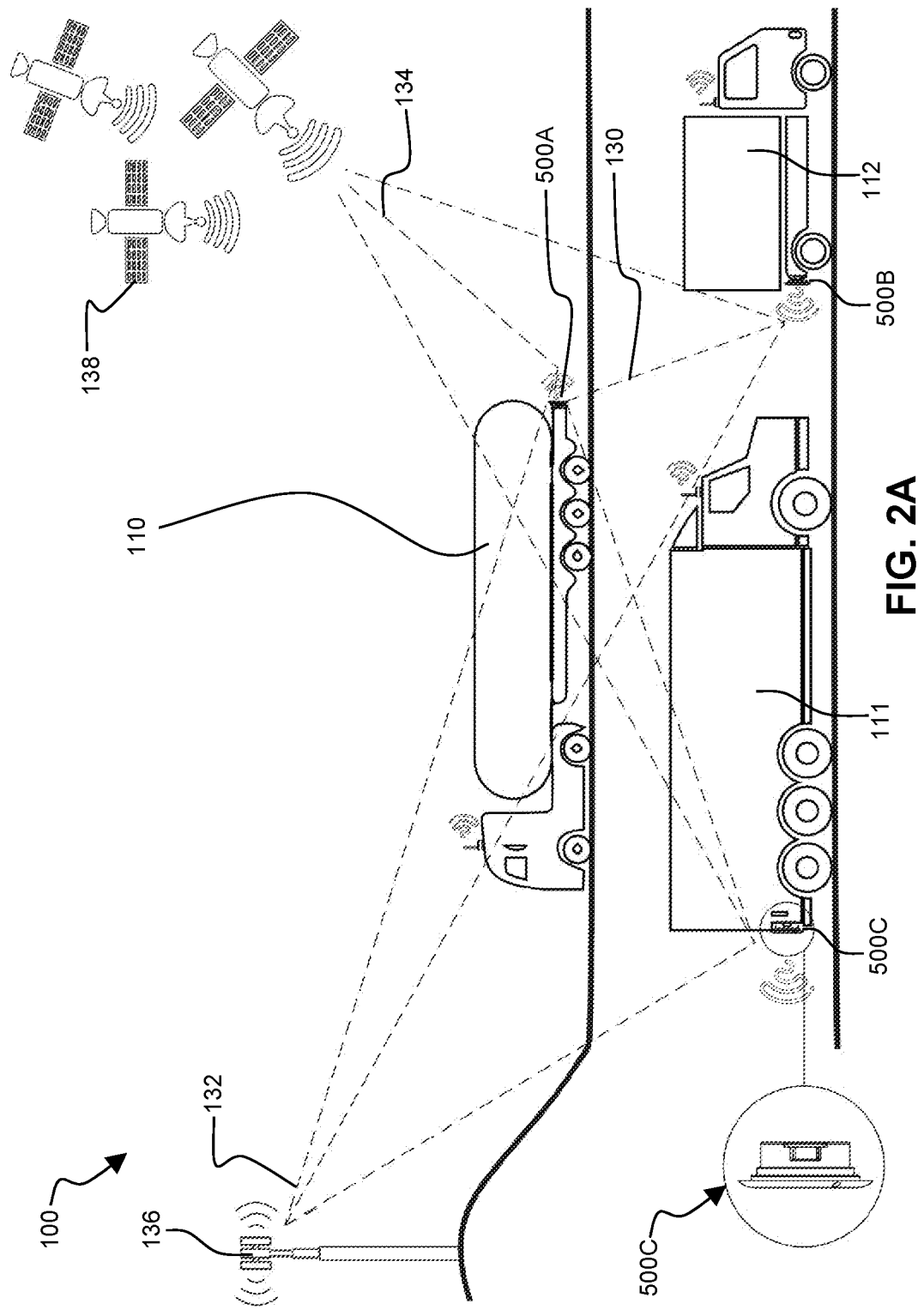
FIG. 2A shows a system for electronic tracking of movable freight containers comprising wireless tracking devices hidden in light fixtures.

FIG. 2A shows a movable freight container electronic tracking and monitoring system 100 that uses an electronic tracking and monitoring device hidden in a vehicle tail light fixture. In FIG. 2A, such tail light fixtures are shown at 500A, 500B, and 500C. The tail light fixture 500A could be attached to a truck trailer of the type shown at 110. The tail light fixture 500C could be attached to a cargo truck 111. The tail light fixture 500B could be attached to a local delivery vehicle 112. The tail light fixture could be attached to a freight vehicle trailer as was shown at 120 in FIG. 1. The tail light fixture 500A could receive information from positioning satellites 138 such as those used for the Global Positioning System (GPS) maintained by the United States, the European Galileo, the Chinese BeiDou-2, or the Russian GLONASS system. This communication connection between the tail light fixture 500A and the positioning satellites 138 is shown at 134. The tail light fixture 500A could also communicate wirelessly and bi-directionally with a terrestrial system such as the communication tower shown at 136, through a wireless communication connection shown at 132. The terrestrial wireless communication tower 136 could communicate using a mobile phone protocol. The terrestrial wireless communication tower 136 could communicate using an IoT (Internet of Things) communication systems and method, such as Bluetooth Low Energy, ZigBee, 6LoWPAN, Z-Wave, IoT over near field communications (NFC), Sigfox, Neul, and LoRa. This IoT technology could use the Message Queuing Telemetry Transport (MQTT) protocol. There could be multiple and redundant communications towers, one or more of which use a mobile phone technology and one or more of which use an IoT technology. The tail light fixture 500A on one vehicle could also communicate with a tail light fixture on another vehicle 500B through a wireless interfleet (or inter-vehicle) communication connection 130. More generally, a tail light fixture on one vehicle could also communicate with the communications system of other vehicles on the road with similar capability, including self-driven vehicles and the communications systems of fixed assets and fixed structures including trucks and containers scanners, borders barriers, toll systems and similar road and highway assets and structures.

Figure 2B:
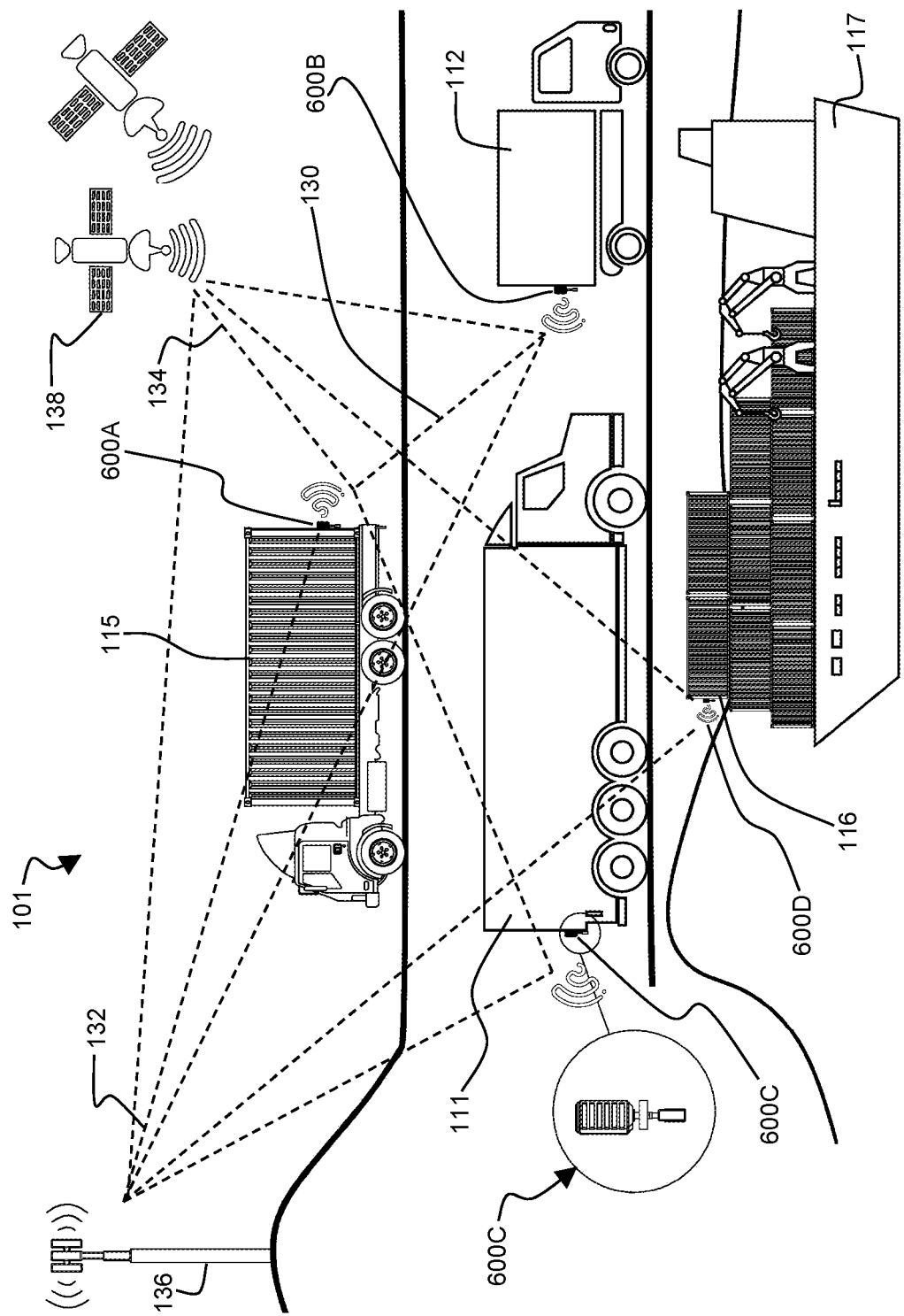
FIG. 2B shows an alternate system for electronic tracking of movable freight containers comprising electronic locks.

FIG. 2B shows an alternate movable freight container electronic tracking and monitoring system 101. The alternate system 101 uses one or more locks that are also electronic tracking and monitoring device(s), as shown at 600A, 600B, 600C, and 600D. The electronic lock 600A could be used to secure a truck-mounted container 115. The electronic lock 600B could be used to secure a cargo compartment of a local delivery vehicle 112. The electronic lock 600C could be used to secure a cargo compartment of a cargo truck 111. The electronic lock 600D could be used to secure a container 116 on a ship 117, or a container, 114 in FIG. 1, on a freight vehicle trailer, 120 in FIG. 1. The electronic lock could be used to secure any container that is at a temporary storage facility (not shown) and more generally any movable storage container located anywhere capable of being understood by anyone skilled in the art.

Further referring to FIG. 2B in view of FIG. 2A, the communication connection with a positioning satellite 134, the communication connection with a tower 132, and the communication connection between electronic devices 130 can operate in a fashion similar to what was described for the system shown in FIG. 2A. The positioning satellite or satellites 138 and communication tower or towers 136 can also be similar to those described with reference to FIG. 2A. It is also possible to combine any element of the system shown in FIG. 1 and FIG. 2A with the system shown in FIG. 2B and vice versa.

Figure 3:
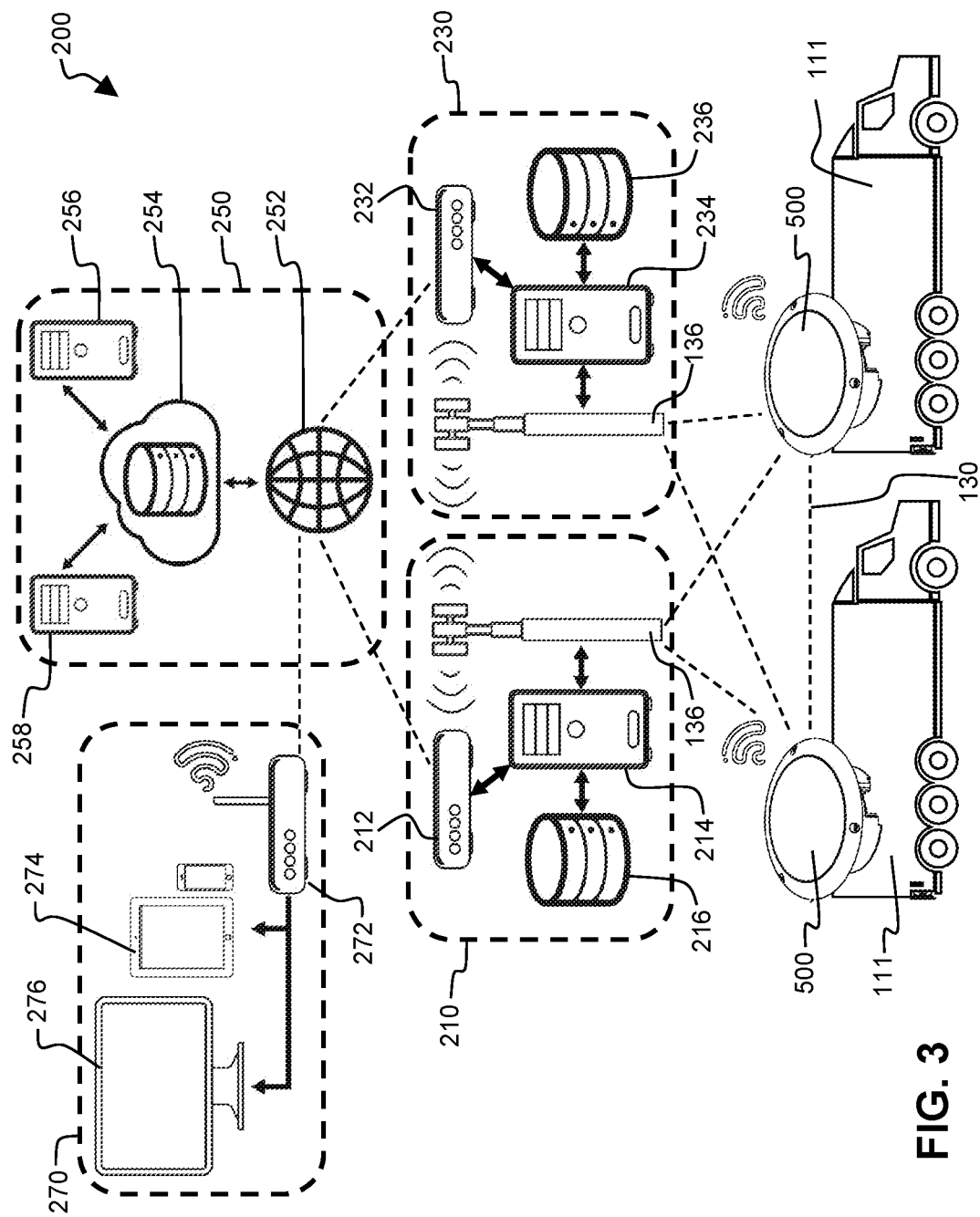
FIG. 3 shows a network topology for the system of FIG. 2A.

FIG. 3 shows a network topology for electronic tracking of movable freight containers 200 in which cargo trucks 111 with tail lights 500 communicate with one or more communication towers 136 and with each other 130. In the embodiment shown in FIG. 3, the cargo trucks 111 can communicate with both a cellular (i.e. mobile phone) network 210 and an IoT network 230. The cellular network 210 can comprise one (or more) communications tower(s) 136, a cellular network modem 212, a cellular network server 214, and a cellular network database 216. The IoT network 230 can comprise one (or more) communications tower(s) 136, an IoT network modem 232, an IoT network server 234, and an IoT network database 236.

Further referring to FIG. 3, the cellular network 210 can communicate with a cloud server 250 through a cellular network modem 212 that connects the cellular network server 214 to the internet 252. Similarly, the IoT network 230 can communicate with the cloud server 250 through an IoT network modem 232 that connects the IoT network server 234 to the internet 252. The cloud server 250 can further comprise a cloud database 254, a cloud analysis server 256, and a cloud data collection server 258.

The cellular network server 214 and database 216 can be used to process and store data received from the tail light fixtures 500 and/or the IoT network server 234 and database 236 can be used to process and store data received from the tail light fixtures 500. The following table shows examples of the type of data that could be stored and the structure of this data:

| Device ID | Datatype | Value | Time Stamp (YYYY-MM-DD-HH-MM-SS) |
|---|---|---|---|
| eCAT-958 | Position | 32.2588°, 50.3698°, 150 m E | 20171206181223 |
| eCAT-958 | Impact | True | 20171209180738 |
| eCAT-958 | PCB temperature | 80° F. | 20171209180738 |
| eCAT-958 | Truck temperature | 76° F. | 20171209180738 |
| eCAT-958 | Tire pressure | 26 PSI | 20171209180738 |
| eCAT-958 | Truck ID | 12584889 | 20171209180738 |
| eCAT-958 | Tire FL ID | 25842287 | 20171209180738 |
| eCAT-958 | Speed | 45 miles/hour | 20171209180738 |
| eCAT-958 | Battery2 voltage | 3.5 V | 20171209180738 |

The embodiment shown in FIG. 3 can also comprise a remote access module 270 that can include a remote access modem 272 configured for communication with the cloud server 250 via the internet 252. The remote access module 270 can include a mobile device interface 274 configured for connection to devices such as a tablet computer or a smart phone. The remote access module 270 could also have a computer device interface 276 configured for connection to a computer such as a laptop or desktop that has a keyboard, graphical user interface, mouse, etc. The remote access module 270 could be used for reporting data from the tail lights 500, programming the tail lights 500, and/or other functions that will be further described in other parts of this document.

Figure 4:
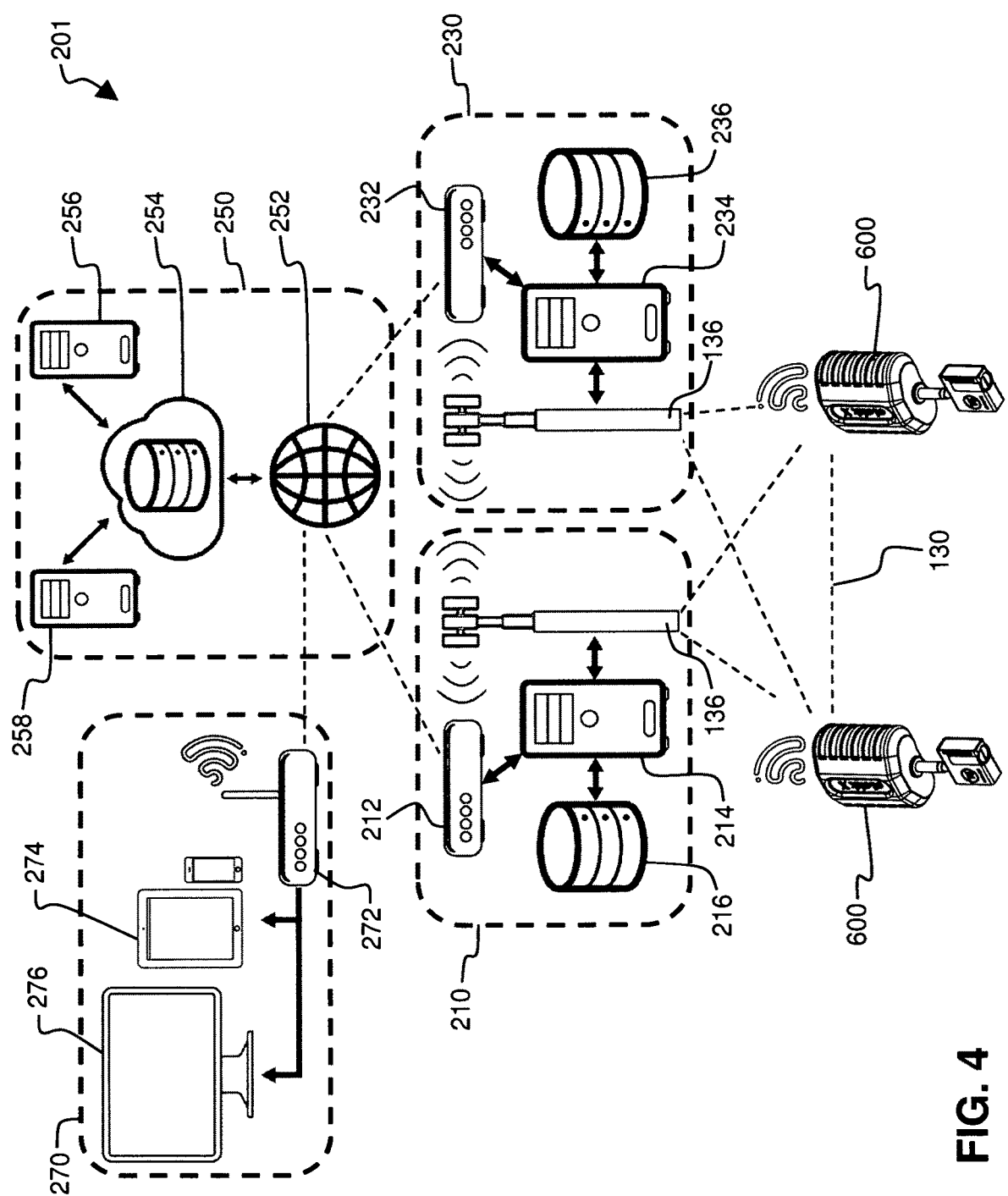
FIG. 4 shows a network topology for the system of FIG. 2B.

FIG. 4 shows an alternate network topology for electronic tracking of movable freight containers in which one or more electronic tracking and monitoring locks 600 communicate with one or more communication towers 136 and with each other 130. In the embodiment shown in FIG. 4, the electronic locks 600 can communicate with both a cellular (or mobile phone) base station 210 and an IoT base station 230 and this communication and the other elements shown in FIG. 4 serve the same functions as the similarly numbered elements that were shown and described with reference to FIG. 3. It is also possible to combine any element of the systems shown in FIG. 1, FIG. 2A, FIG. 2B and FIG. 3 with the system shown in FIG. 4 and vice versa. The system can also be configured so that any device such as any lock shown at 600 or any tail light shown at 500 could be controlled by external operators via the mobile device interface 274 or the computer device interface 276.

Figure 5:
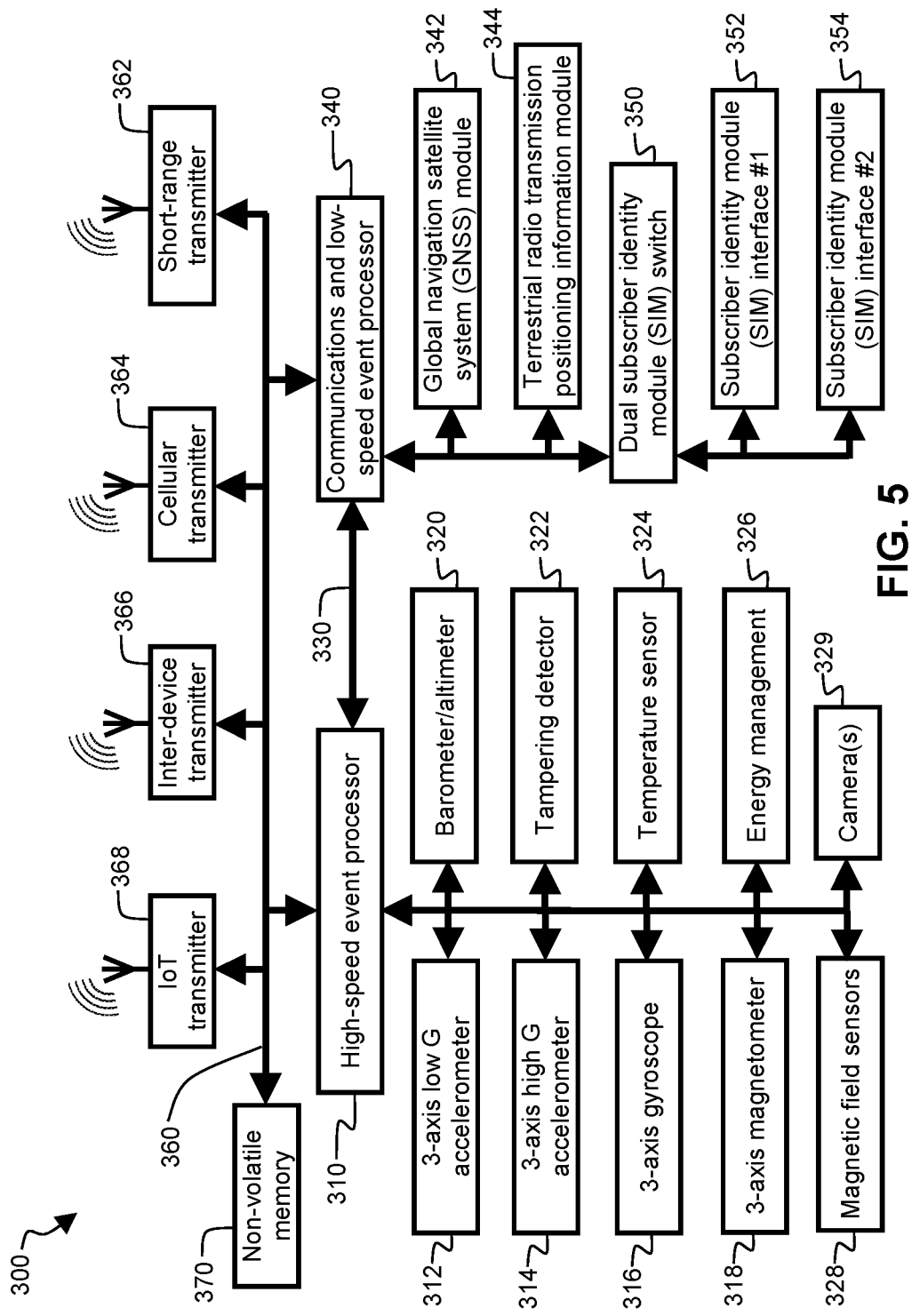
FIG. 5 is an exemplar block diagram of the functional elements of the wireless networked devices shown in FIG. 1 through FIG. 4.

FIG. 5 shows a block diagram of the main functional elements of an electronic tracking and monitoring module 300. In one embodiment, the electronic tracking and monitoring module 300 comprises a high-speed event processor 310 and a low-speed event processor 340 that share a processor communication link 330. In one embodiment the processor communication link 330 is a dedicated serial connection. This serial connection can use a universal synchronous and asynchronous receiver-transmitter and could run in either a synchronous mode or an asynchronous mode. The processor communication link 330 can operate in a full duplex serial communication mode.

In the embodiment shown in FIG. 5, the high-speed event processor 310 can be connected to a 3-axis low g-force accelerometer 312, a 3-axis gyroscope 316, and a 3-axis magnetometer 318. These devices (the low g-force accelerometer 312, gyroscope 316, and magnetometer 318) can be in a single 9 degree of freedom insertional measurement unit (9-DOF IMU). The implementation of the IMU in embodiments of the present invention will be further described later in the document with reference to FIG. 18A, FIG. 18B, FIG. 19, and FIG. 20A and FIG. 20B. The system can also include a 3-axis high g-force accelerometer 314, a barometer/altimeter 320, a tampering detector 322 configured to measure an atmospheric pressure and convert this to a barometric measurement or an altitude measurement, a temperature sensor 324, and an energy management circuit 326. The low g-force accelerometer 312 and/or the high g-force accelerometer 314 could be used to measure acceleration, vibration, and/or shock information. This acceleration, vibration, and/or shock information, as well as any other information in the electronic tracking and monitoring module 300, could be stored in the non-volatile memory 370, and transmitted to other parts of the system through any of the transmitters (368, 366, 364, or 362) to other parts of the system or externally to any parts of the systems that were described with reference to FIG. 1 through FIG. 4.

The system could also include a camera or cameras, as shown at 329. This camera or cameras could be used as part of a multi-factor authentication process using iris or face scanning. The system could also use other biometrics, such as fingerprints.

If the embodiment shown in FIG. 5 is used as an electronic lock, the high-speed event processor 310, could also communicate with magnetic field sensors (magnetic sensors), as shown at 328, the functionality of which will be further described later in this document. These magnetic field sensors 328 could be used to generate an alarm signal which could be stored and/or transmitted using any of the functionality described in this document.

Further referring to FIG. 5, the low speed event processor 340 can be connected to a global navigation satellite system (GNSS) module 342, a terrestrial radio transmission positioning information module 344, and a dual subscriber identity module (dual SIM) switch 350. The dual SIM switch 350 in turn will connect with a first subscriber identity module (SIM) interface 352 and a second subscriber identity module (SIM) interface 354. The two SIM interfaces 352 and 354 can connect to subscriber identity module cards (SIM cards) that store an international mobile subscriber identity (IMSI) number and its related key, which are used to identify and authenticate subscribers on mobile telephony devices. More generally, a SIM card can be referred to as smart cards or universal integrated circuit cards (UICCs). A SIM card typically stores its unique serial number (ICCID), international mobile subscriber identity (IMSI) number, security authentication and ciphering information, temporary information related to the local network, a list of services the user has access to, and two passwords: a personal identification number (PIN) for ordinary use and a personal unblocking code (PUK) for unlocking. Two SIM interfaces 352 and 354 can be used so the system 300 can use two different SIM cards for two different mobile phone networks to provide backup if the system 300 is in a location where one of the mobile phone networks is not available. The dual SIM switch 350 can be any device configured for electronically multiplexing more than one SIM connection. It is a multi-pole double-throw switch so that all of the necessary active connections of a typical subscriber identity module (SIM) are switched from one SIM to another. One example of such as switch is the FSA2567 made by Fairchild Semiconductor Corporation. In one embodiment, the system can be configured so that one or more of the subscriber identity modules (SIMs) can be non-removable SIMs, which are typically called embedded SIMs or eSIMs.

The terrestrial radio transmission positioning information module 344 can be configured to detect the distance and/or direction from the electronic tracking and monitoring module 300 to a plurality of communication towers (136 in FIGS. 2A/2B/3/4) and/or receive detected information of the distance and/or direction from a plurality of communication towers (136 in FIGS. 2A/2B/3/4) to the electronic tracking and monitoring module 300. Techniques for measuring distance and/or direction between one or more communication towers and the device or vice versa can include multi-lateration (also known as hyperbolic navigation), trilateration timing, triangulation, relative transmission power level measurement, Cell ID (unique number used to identify each base station transceiver or sector of a base station transceiver), angular direction determination from an antenna pattern, antenna phase discrimination, and other techniques for signal direction finding. The Cell ID, distance, and/or direction information can then be further improved through averaging, interpolation, and other types of computation to determine a relative location. Having determined a relative position of the electronic tracking and monitoring module 300 to the towers (136 in FIG. 2A/2B/3/4), absolute location of the module 300 can then be calculated based on combining the relative position information with known and unchanging absolute position information for the towers (136 in FIG. 2A through FIG. 4).

The terrestrial radio transmission positioning information module 344 can also work in conjunction with the GNSS module 342 to improve the speed or accuracy of a position for the module 300 by using Assisted Global Positioning System (A-GPS) techniques. These A-GPS techniques can comprise (a) receiving orbital data or almanac information more quickly from a terrestrial tower (136 in FIG. 2A through FIG. 4) than would be available from a GNSS satellite and/or (b) calculation of the position of the module by combining information received by the module 300 from the GNSS satellite (138 in FIG. 2A and FIG. 2B) with information received by the terrestrial tower (136 in FIG. 2A through FIG. 4) from the GNSS satellite (138 in FIG. 2A and FIG. 2B).

The tampering detector 322 in FIG. 5 can be configured to detect any attempt by a person to open the electronic tracking and monitoring device (500 or 500A/B/C in FIG. 1, FIG. 2A, and FIG. 3 or 600 or 600A/B/C/D in FIG. 2B and FIG. 4). In one embodiment, the tampering device 322 is a switch that is configured to detect opening of the electronic tracking and monitoring device. The tampering detector 322 could also be implemented using a different type of sensor such as a magnetic sensor, a light sensor, or any other technology capable of being understood by anyone skilled in the art.

The electronic tracking and monitoring module 300 in FIG. 5 can be configured with a short-range communications transmitter 362, a cellular communications transmitter 364, inter-device communications transmitter 366, and an IoT (Internet of Things) communications transmitters 368. In one embodiment these communications transmitters (362, 364, 366, and 368) are managed by the low-speed event processor 340 over a communications bus 360. The electronic tracking and monitoring module 300 can also comprise a non-volatile memory 370 that can be used for logging data from any of the devices in the module 300. This non-volatile memory 370 could be flash memory that could be used to log and store measured data during the time when no data transmission can occur. The logged data can then be transmitted once a transmission connection is re-established. The logged data can comprise position information and event information, such as impacts and impact intensity, temperatures and other environmental parameters, and lock openings and closings, as well as other information associated with any element of the system shown in FIG. 5. This logged information could be stored with time stamps and this time stamp information can then be later used to reconstruct a timeline of everything that has happened to the electronic tracking and monitoring module 300 and associated cargo.

The data stored in the non-volatile memory, 370 in FIG. 5, can comprise magnetic field alarm information, inertial information, geographic position and geographic boundary information, environmental information, loss of communication alarm information (such as loss of communication with a fixed physical asset), and tampering alarm information. This information could be encrypted. Data stored in other parts of the system including, but not limited to data stored in the remote access module, 270 in FIG. 4, data stored in the cloud database, 254 in FIG. 4, data stored in the cellular network 210 in FIG. 4, and data stored in the IoT server, 230 in FIG. 4, could also be encrypted. Similarly, all transmission of data between any component in the system as shown in FIG. 1, FIG. 2A, FIG. 2B, FIG. 3, FIG. 4, and FIG. 6 could be encrypted.

The cellular transmitter 364 in FIG. 5 can be used for bi-directional communication with the communication tower 136, shown in FIG. 2A, FIG. 2B, FIG. 3 and FIG. 4 and the cellphone network 210 in FIG. 3 and FIG. 4. The IoT transmitter 368 in FIG. 5 can be used for bi-directional communication with the communication tower 136, shown in FIG. 2A, FIG. 2B, FIG. 3 and FIG. 4 and the IoT network 310 in FIG. 3 and FIG. 4. The inter-device transmitter 366 in FIG. 5 can be used for bi-directional communication between electronic tracking and monitoring devices, such as the taillight fixtures 500 shown in FIG. 1, FIG. 2A and FIG. 3 and/or the electronic locks 600 shown in FIG. 2B and FIG. 4.

The short-range transmitter 362 in FIG. 5 can be used for wired or wireless mesh networking or for a Bluetooth connection with peripherals, such as tablet computers that could download data from the electronic tracking and monitoring module 300. In one embodiment, the short-range transmitter 362 in FIG. 5 is part of a wireless mesh network, such as the one illustrated in FIG. 6.

Figure 6:
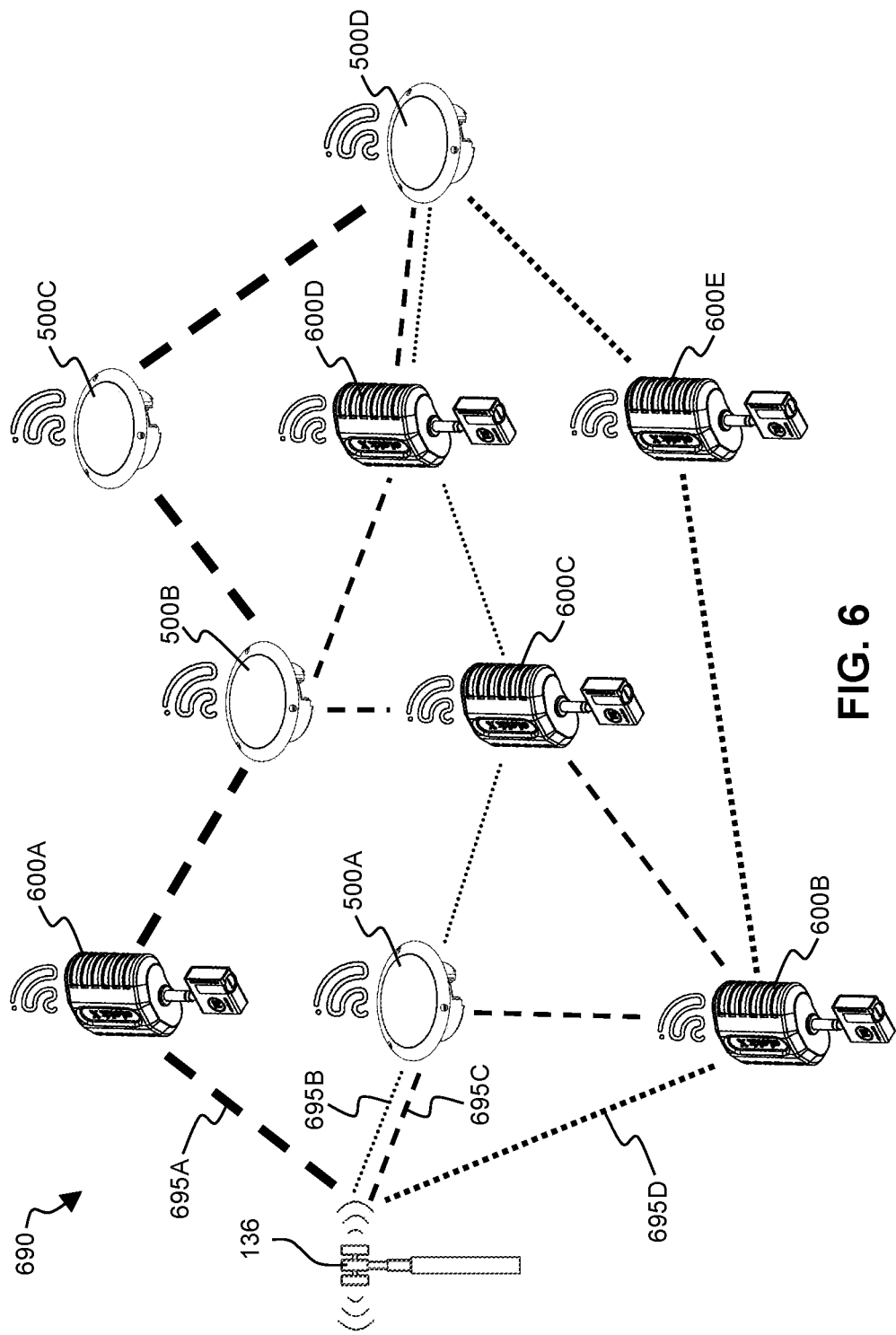
FIG. 6 illustrates an embodiment of a mesh network used as part of the systems shown in FIG. 1 through FIG. 4.

Referring in more detail to FIG. 6, a mesh network, and more specifically a wireless mesh network is shown at 690. The wireless mesh network 690 provides a plurality of communication nodes (more specifically wireless communication nodes) between the communication tower 136 and an electronic tracking and monitoring device 500D. The specific device shown at 500D is a device configured to be hidden in a vehicle tail light fixture, as was described previously. The wireless mesh network 690 comprises a plurality of possible communication paths, shown at 695A, 695B, 695C, and 695D between the communication tower 136 and the electronic tracking and monitoring device 500D using a variety of nodes, shown at 500A, 500B, 500C, 600A, 600B, 600C, 600D and 600E. Each path has been shown with a different type of dotted line. For example, path 695A goes to and from the communication tower 136 via lock 600A, tail light fixture 500B, tail light fixture 500C, and tail light fixture 500D. The communication path for the data can be chosen on an ad hoc basis based on performance parameters such as available communication bandwidth, availability of a node or nodes for communication, minimization of number of hops, signal error rates, and any other parameter capable of being understood by anyone skilled in the art. The communication tower 136 could be replaced by any other communication gateway such as a WiFi router, a cellphone tower, a communications satellite, a Zigbee or Xbee communications gateway or any other communications device capable of being understood by anyone skilled in the art. Communication between nodes could be using any wired or wireless communication protocol such as WiFi, Xbee, Zigbee, etc.

Referring to FIG. 6 in conjunction with FIG. 1, it should be noted that the redundant mesh network communication shown in FIG. 6 can also be applied to intra-vehicle communication connections, such as those shown at 122 in FIG. 1. Such redundant mesh network connections could be used to communicate between any element of the system illustrated in FIG. 1 with any other element in this system. For example, a vehicle could have multiple devices hidden in taillights.

Figure 7:
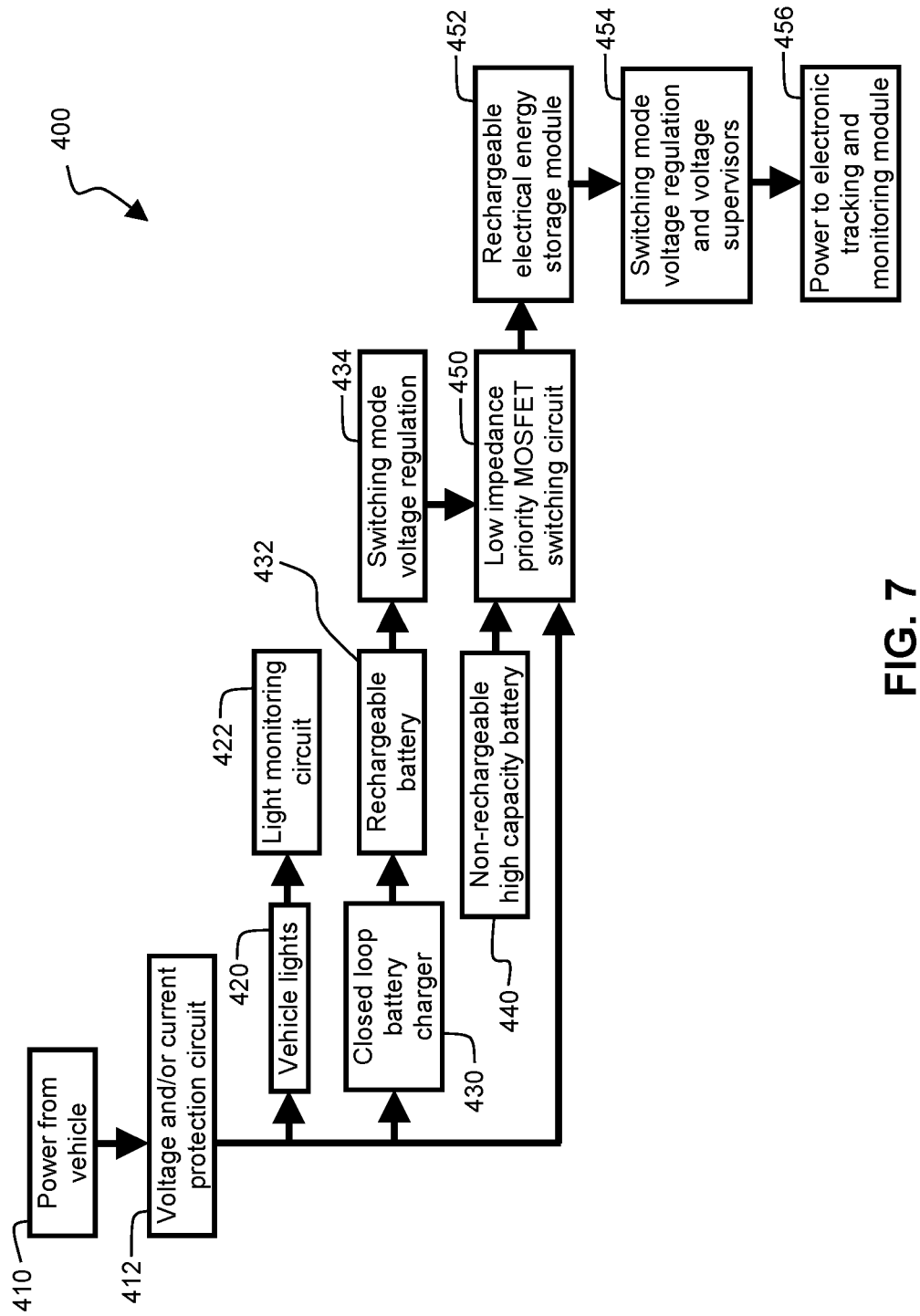
FIG. 7 shows a block diagram of a power module for the tracking devices of FIG. 1 through FIG. 5.

FIG. 7 illustrates an electrical power circuit 400 that can be used with embodiments of the present invention. The electrical power circuit 400 shown in FIG. 7 is configured for situations in which external electrical power is available. More specifically, the embodiment shown in FIG. 7 receives power from a vehicle, as shown at 410. A voltage and/or current protection circuit 412 can be used to protect the device from being plugged into the wrong voltage or to protect against voltage and/or current spikes. Such a protection circuit 412 can comprise a fuse, a zener diode, and/or a thyristor. The protected electrical power can then be used to power vehicle lights 420, a battery charger 430, and a switching circuit. The vehicle lights 420, could be incandescent, they could be halogen lights, they could be LED lights, and/or they could be any other electrical illumination source capable of being understood by someone skilled in the art. The vehicle lights 420 could be connected to a light monitoring circuit 422 that determines whether the lights are burning by determining whether they are drawing current.

Further referring to FIG. 7, the battery charger 430 can be a configured to provide electrical power to a rechargeable battery 432 in a closed-loop fashion in which the charger output current and/or voltage are regulated in response to a comparison with a reference value. The rechargeable battery 432 can use any electrical energy storage technology capable of being of understood by anyone skilled in the art such as alkaline, lithium ion, lithium polymer, lithium phosphorous, nickel cadmium, nickel metal hydride, zinc oxide, and lead acid. The system can also comprise a non-rechargeable high capacity battery 440. The rechargeable battery 432 and non-rechargeable battery 440 provide backup in case the power from the vehicle 410 (as regulated by the voltage and/or current protection circuit 412) is not available.

As shown in FIG. 7, the source of power from either of the batteries, 432 and 440, or the vehicle power 410, can be selected by means of a switching circuit, shown at 450. The electrical power from the rechargeable battery 432 can pass through a switching mode voltage regulator 434 before being supplied to the switching circuit 450. The switching circuit 450 can use low impedance priority MOSFET technology to optimally regulate the power supplied to a rechargeable electrical energy storage unit 452. This electrical storage unit 452 could any combination of capacitor(s), supercapacitor(s), hybrid capacitor(s), rechargeable battery(s), and/or pulse capacitor(s) capable of being understood by anyone skilled in the art. The electrical storage unit 452 output could be controlled by voltage regulator(s) and/or supervisor(s) 454 before being supplied as freight electronic tracking unit power 456.

Figure 8:
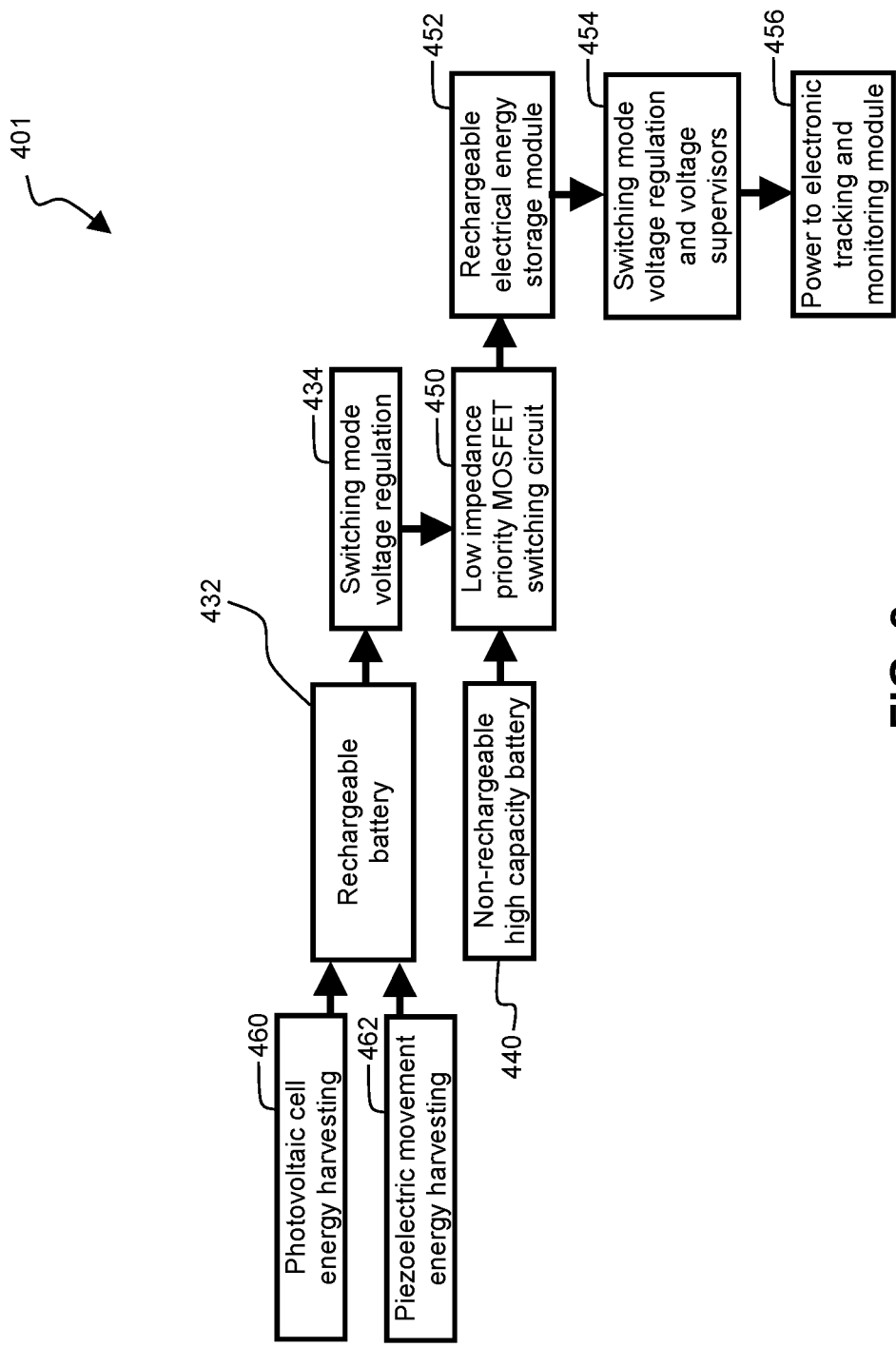
FIG. 8 shows a block diagram of an alternate power module for the tracking devices of FIG. 1 through FIG. 5.

FIG. 8 illustrates an alternative embodiment of an electrical power circuit 401 that can be used with embodiments of the present invention. The alternative embodiment electrical power circuit 401 shown in FIG. 8 is configured for situations in which external electrical power is not available. The alternative embodiment 401 shown in FIG. 8 and the embodiment 400 shown in FIG. 7 both use the non-rechargeable battery 440, the rechargeable battery 432, the switching mode voltage regulator 434, the low impedance priority MOSFET switching circuit 450, the rechargeable electrical energy storage unit 452, and the switching mode voltage regulation and voltage supervisors 454 in the same way to power the electronic tracking and monitoring module 456. Because external electrical power is not available in the alternate embodiment, 401 shown in FIG. 8, this embodiment 401 is configured to harvest electrical energy using a photovoltaic cell 460 and/or a piezoelectrical movement element 462. The piezoelectrical movement element 462 can use the movement of a mass or a pendulum to generate electrical power from the displacement of the mass or pendulum as a result of movement of the device. Such movement could be a vibration, which would result in the ability to harvest vibrational energy.

Figure 9A:
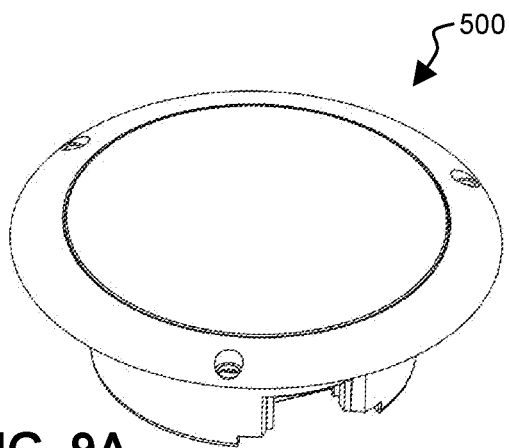
FIG. 9A is an isometric top view of a tail light fixture that was shown as part of FIG. 1, FIG. 2A and FIG. 3.
Figure 9B:
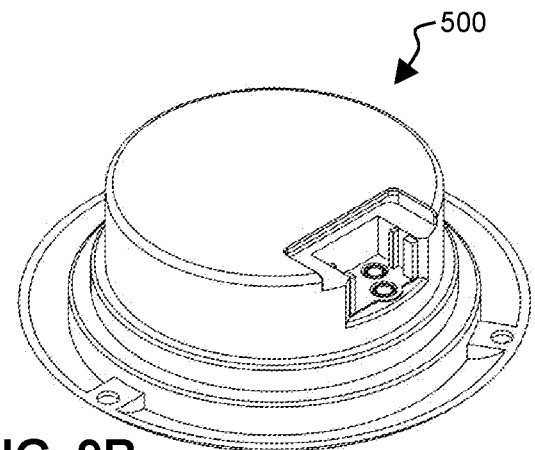
FIG. 9B is an isometric bottom view of the tail light of FIG. 9A.
Figure 9C:
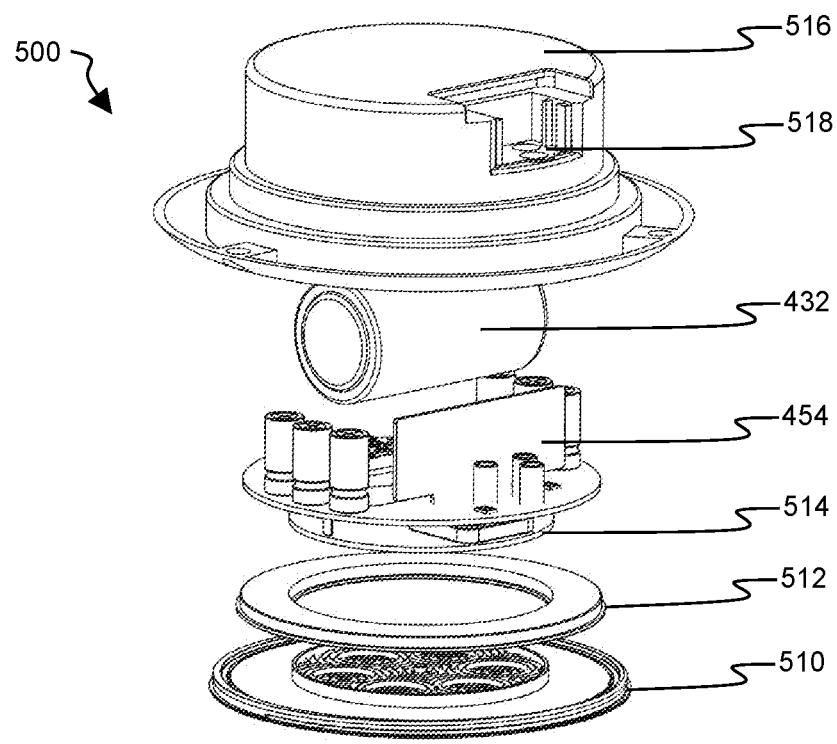
FIG. 9C is an exploded view of the tail light of FIG. 9A and FIG. 9B.

FIG. 9A, FIG. 9B, and FIG. 9C show a tail light fixture 500 that can be used for electronic tracking and monitoring of movable freight containers. FIG. 9A shows an isometric top view of the electronic tail light fixture 500. FIG. 9B, shows an isometric bottom view of the tail light fixture 500. FIG. 9C shows an exploded view of the tail light fixture 500. Referring to FIG. 9C, the electronic tracking tail light fixture 500 comprises an external lens 510, an internal lens and/or diffuser 512, an electronic circuit board with light sources and antennas 514, the rechargeable electrical energy storage unit 454 and rechargeable battery 432 that were also discussed with reference to FIG. 4, a back cover 516, and a standard light connector 518. The standard light connector 518 is used to get the power from the vehicle, 410 in FIG. 7.

Further referring to FIG. 9C, the electronic circuit board with light sources and antennas 514 comprises the circuit elements that were shown with reference to FIG. 5. The electronic circuit board with light sources and antennas 514 also comprises the voltage and/or current protection circuit 412, the vehicle lights 420, the light monitoring circuit 422, the closed loop battery charger 430, the switching mode voltage regulation 434, the non-rechargeable high capacity battery 440, the low impedance priority MOSFET switching circuit, and the switching mode voltage regulation and voltage supervisors 454 that were shown with reference to FIG. 7.

Figure 9D:
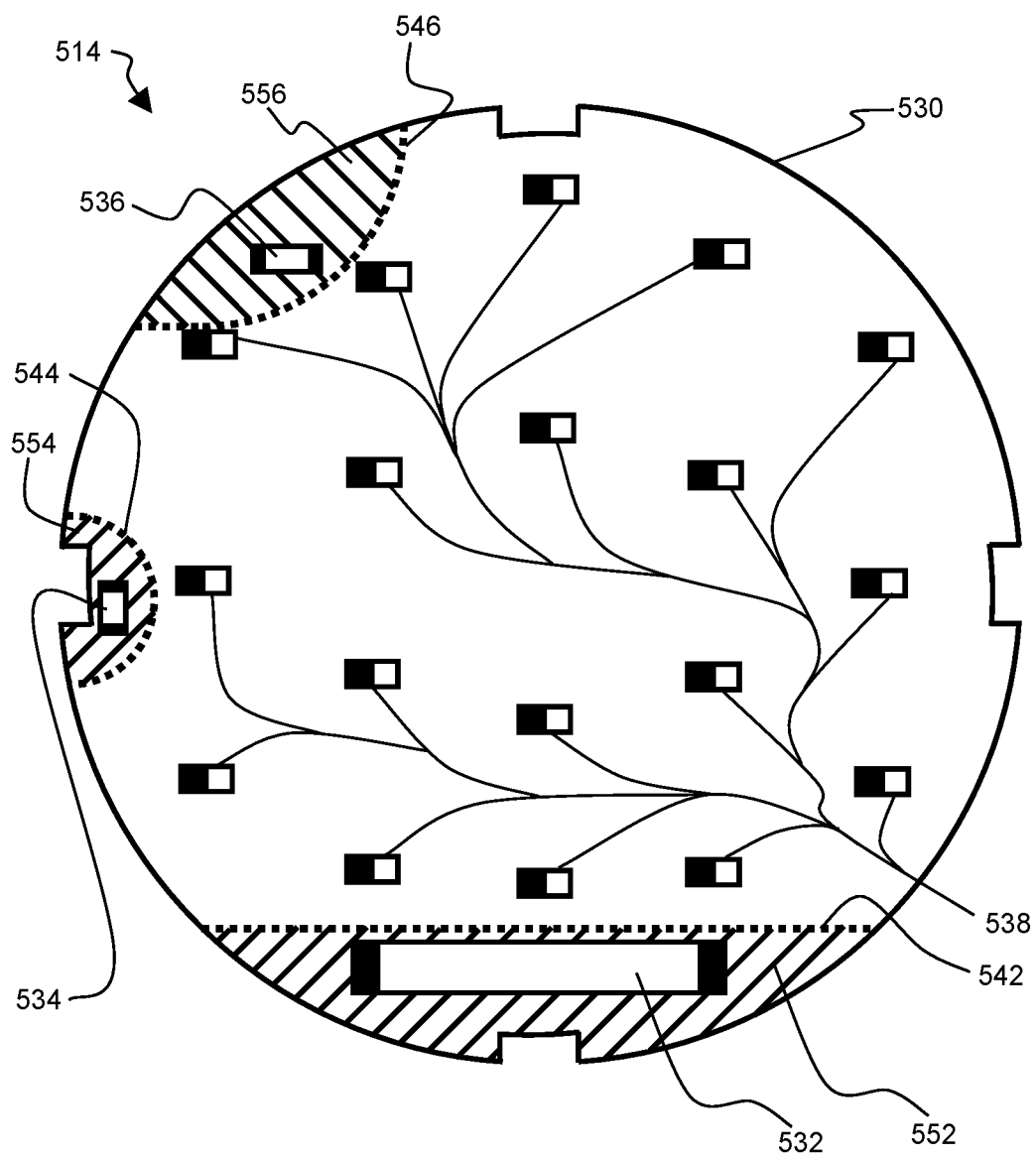
FIG. 9D shows the layout of the circuit board for the tail light to illustrate the relative placement of the three main antennas for GPS/GNSS, mesh networking, and cellular communication.

FIG. 9D shows the layout of the electronic circuit board 514 of FIG. 9C to illustrate the relative placement of the three main antennas (for GPS/GNSS, mesh networking, and cellular communication) and the associated ground planes and electromagnetic shielding. The selection of the antennas, location and orientation of the antennas, location and size of the related ground planes, and associated electromagnetic shielding is very critical to the performance of this multi-antenna system. A lot of analysis has gone into optimizing this configuration to minimize electromagnetic interference and to ensure that the antennas will perform adequately when used a part of taillight fixture that's attached to trailer or cargo container, that acts as an electromagnetic shield. Referring to FIG. 9D, the electronic circuit board assembly is shown at 514. This circuit board assembly 514 comprises a printed circuit board 530. It also typically included the components described previously with reference to FIG. 5, FIG. 7, and FIG. 8, many of which are not shown in FIG. 9D. What is shown in FIG. 9D are the light sources 538, antennas 532, 534, and 536, and associated electromagnetic shielding shown at 542, 544, and 546. The light sources 538 in this embodiment are light emitting diodes (LEDs) that are electrically connected to the printed circuit board 530. In the embodiment shown, there are 18 LEDs that are surface-mounted on the printed circuit board 530 to produce an approximate circle of light for the circular tail light assembly that was shown in FIG. 9A, FIG. 9B, and FIG. 9C.

Further referring to FIG. 9D, the circuit board assembly 514 comprises a cellular phone antenna, shown at 532. In the embodiment shown, the cellular phone antenna 532 is a ceramic omnidirectional monopole antenna configured for receiving and transmitting radio waves in a range of frequencies from 800 megahertz to 2.2 gigahertz. The cellular phone antenna 532 is surface mounted on a ground plane on the printed circuit board 530 and is further electromagnetically isolated from other parts of the circuit board by ground vias in the printed circuit board shown at 542. These ground vias 542 can be combined with an electromagnetic shield that is perpendicular to the plane of the circuit board 530 to provide maximum shielding.

Due to the fact that the circuit board assembly 514 will be mounted vertically against a metal surface (typically, the vertical wall of a truck trailer or cargo container) and that the truck trailer or cargo container could sometimes be angled with the back of the trailer/container pointing partly downward, obscuring a direct vertically upwards electromagnetic, the configuration shown in FIG. 9D can be very sensitive to the type of antennas chosen and their positions on the circuit board. For these reasons, the cellular phone antenna 532, in the embodiment shown, is a ceramic multi-band surface mount antenna that is horizontally oriented when in use. In one embodiment, the cellular phone antenna 532 is a Taoglas PA-25 antenna specifically designed for automotive applications. The approximately 35 mm long (¼ wavelength=2150 Megahertz) cellular phone antenna 532 is mounted onto a cellular antenna ground plane 552 that is at least 45 mm long in the direction of the antenna 532 to optimize efficiency in the cellphone frequency ranges of 824-960 MHz and 1700-2170 MHz. It should further be noted that the efficiency of this antenna in the 824-960 MHz range increases significantly if the ground plane 552 can be on the order of ½ wavelength, which calculates out to greater than 7 mm, which is approximately the maximum length of the cellular antenna ground plane 552 shown in FIG. 9D.

The circuit board assembly 514 also comprises a Global Navigation Satellite System (GNSS) antenna, shown at 534. Such antennas are also referred to as GPS, Galileo, BaiDou, or GLOSNASS antennas, depending upon the satellite navigation system being used. In the embodiment shown, the GNSS antenna 534 is an omnidirectional loop antenna optimized to receive satellite timing signals at a frequency of 1575.42 MHz. The GNSS antenna 534 is oriented orthogonally from the cellular phone antenna 532 and mesh networking antenna 536 on the circuit board assembly 514 to minimize electromagnetic interference and to optimize received signal strength. For this application, a ceramic loop antenna provides at least three times better efficiency than a traditional polarized linear antenna for the frequency range being used. It is also about 3× smaller in all dimensions than an equivalent patch antenna. The GNSS antenna 534 is mounted on a GNSS antenna ground plane 554 on the edge of the circuit board 530 and electromagnetically isolated from other parts of the circuit board by ground vias in the printed circuit board shown at 544. These ground vias 544 can be combined with an electromagnetic shield that is perpendicular to the plane of the circuit board 530 to provide maximum electromagnetic shielding. In one embodiment, the GNSS antenna 534 is a Taoglas GLA.01 low profile surface mount antenna.

The circuit board assembly 514 further comprises a mesh networking antenna, shown at 536. In the embodiment shown, the mesh networking antenna 536 is an omnidirectional monopole antenna configured to send and receive electromagnetic signals in a range of frequencies from 2200 MHz to 2800 MHz with optimal performance in a range of frequencies from 2400 MHz to 2500 MHz to match the requirements for Zigbee and 802.11 b/g/n WiFi. In order to fit into a size smaller than ¼ wavelength, the mesh networking antenna 536 comprises small antenna segments that are oriented at angles or arcs to each other and are connected to one another at their ends to create a folded line that never loops having a total length of approximately 30 mm (equal to ¼ of a wavelength at a frequency of 2450 MHz). However, the package size is no greater than 7 mm (less than 1/16 of a wavelength) in its maximum dimension. In one embodiment, the mesh networking antenna 536 is a Fractus FR05-S1-N-0-102 antenna using the principles described in U.S. Pat. No. 7,148,850. The mesh networking antenna 536 is oriented parallel to the cellular phone antenna 532 and orthogonal to the GNSS antenna 534. The mesh networking antenna 536 is surface mounted onto the circuit board 530 and electromagnetically isolated from other parts of the circuit board by mesh networking ground vias 546 in the printed circuit board. These ground vias 546 can be combined with an electromagnetic shield that is perpendicular to the plane of the circuit board 530 to provide maximum electromagnetic shielding. There is a mesh networking antenna ground plane 556 in the circuit board 530, which helps to optimize performance of the mesh networking antenna 536 for this configuration.

The three antennas 532, 534, and 536 and the LEDs 538 are all mounted on the external surface of the circuit board assembly in order to be as far away as possible from the steel on the truck chassis and to have a clear as possible of a line-of-sight to the "outside world". The three antennas 532, 534, and 536 and the LEDs 538 are mounted in a coplanar configuration to minimize assembly cost. All of the components on the circuit board assembly 514 fit inside of a 4-inch diameter tail light fixture, such as the unit shown in FIGS. 9A, 9B, and 9C.

Referring to FIG. 9A, FIG. 9B, FIG. 9C, and FIG. 9D in conjunction with FIG. 1, it should be noted that all of the features and elements of the tail light fixtures shown in FIGS. 9A to 9D could also be incorporated in a marker light fixture, wherein an electronic tracking and/or monitoring device hidden in a marker light fixture 501 (smart remote GPS antenna) in FIG. 1 would be located high on a motor vehicle trailer and/or freight container 114 in FIG. 1, at a region proximate to the top of the movable freight container 114 in FIG. 1. Placing an electronic tracking and/or monitoring device in a marker light fixture can have the following functional advantages:

(a) A GPS (or other types of GNSS) antenna that is high up is in a better position to receive more signals from more satellites than one that is shielded from viewing some of the positioning satellites by the metal enclosures of a freight container;
(b) Redundant GPS (or other types of GNSS) devices can improve the capability for the system to pick up at least one positioning signal;
(c) The redundant GPS (or other types of GNSS) devices can improve positional accuracy.

More generally, the device in the marker light fixture, 501 (smart remote GPS antenna) in FIG. 1, can be used as a remote device in a system that also has a electronic tracking and/or monitoring device hidden in the vehicle tail light, 500 in FIG. 1, FIG. 9A, FIG. 9B, and FIG. 9C. In this case, the remote device 501 (smart remote GPS antenna) can make an important functional improvement to the operation of the system. It is difficult to receive GNSS (Global Navigation Satellite Signals) from a location that does not have a clear view of as much of the sky as possible. Since the taillight is near the bottom of the freight container, it is difficult to reliably receive a high quality GNSS signal. This problem is even worse if the vehicle is backed up at a loading dock. In such cases, there is a significant benefit to having a remote device configured for attachment to the vehicle at a location higher on the vehicle that is separate from the taillight. This remote device could be part of a marker light 501 (i.e. a smart remote GPS antenna) in FIG. 1. It could be module placed on top of the freight container. It could be any other device placed anywhere on the vehicle, preferably as high on the vehicle as possible and preferably at a location that facilitates communication with the taillight device 500. Like the taillight device 500, the remote device 501 (smart remote GPS antenna) needs to comprise a remote device global navigation satellite system antenna and this antenna should be configured to receive electromagnetic signals at frequency of 1575.42 MHz. Typically, the remote device 501 would include a processor and this processor would be configured for converting the GNSS signals into position information, just like for the taillight device 500, if the taillight device has GNSS capabilities. The remote device 501 would also be configured for communicating with the taillight 500, which means that the remote device might also have any and/or all of the transmitters described with reference to FIG. 5. In at least one embodiment, the remote device 501 is configured for communicating position information with the taillight (tracking) device 500 using a mesh networking antenna configured for transmitting and receiving electromagnetic signals in the range of 2400 MHz to 2500 MHz. It can be understood that the remote device 501 could have any and all of the same characteristics, features, and configuration of the taillight tracking device described herein.

Figure 10A:
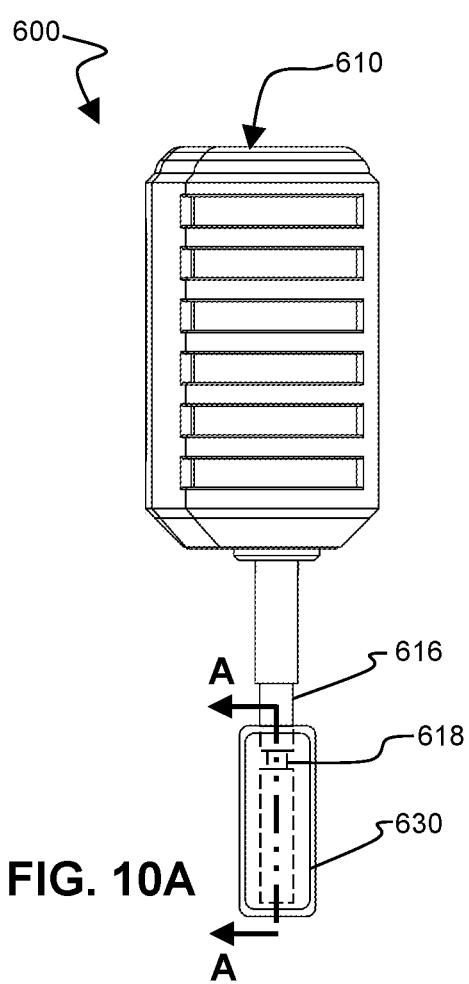
FIG. 10A is a side view of the lock shown in FIG. 2B, FIG. 4, and FIG. 6 showing a mechanical lock module attached to an electronic module.
Figure 10B:
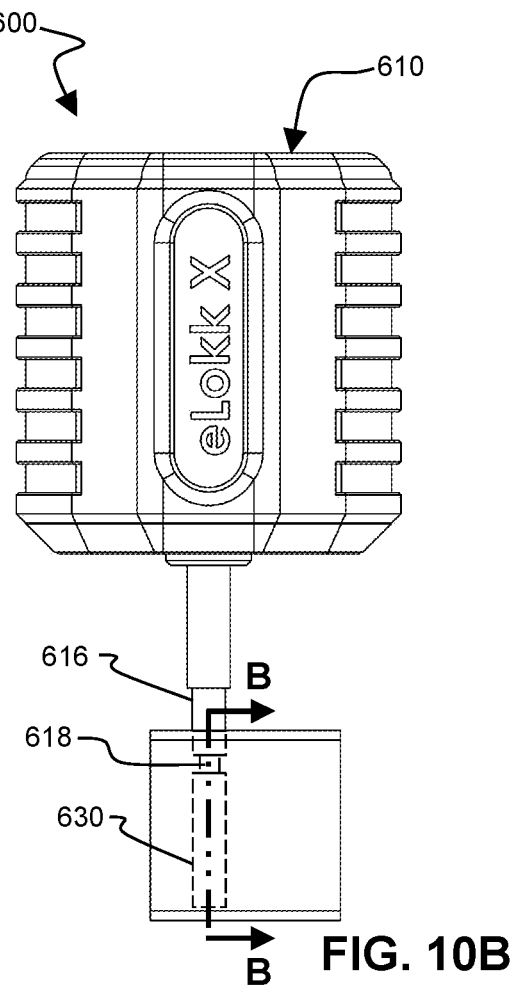
FIG. 10B is a front view of the lock of FIG. 10A.
Figure 10C:
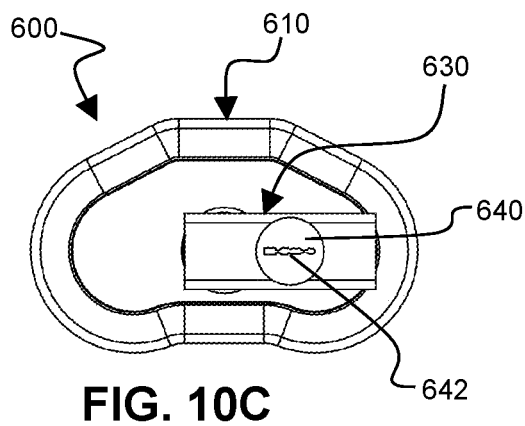
FIG. 10C is a bottom view of the lock of FIG. 10B.

FIG. 10A, FIG. 10B, and FIG. 10C show three orthogonal views of an electronic tracking and monitoring lock 600 for movable freight containers. This electronic tracking and monitoring lock 600 was previously shown in FIG. 2B (at 600A, 600B, 600C, and 600D), in FIG. 4 and in FIG. 6 (at 600A, 600B, 600C, 600D, and 600E). FIG. 10A is a side view. FIG. 10B is a front view. FIG. 10C is a bottom view.

FIG. 11 is an exploded front view of the lock 600. Referring to FIG. 10A, FIG. 10B, FIG. 10C, and FIG. 11, the lock 600 comprises an electronic module, shown at 610, and a mechanical lock module, shown at 630. FIG. 11 shows a mechanical key 680 inserted in the mechanical lock module 630. This mechanical key 680 can be part of the system and method used to secure the mechanical lock module 630 to the electronic module 610, as well as allowing the mechanical lock module 630 to be user attached to and detached from the electronic module 610. FIG. 10C shows a keyhole 642 into which the mechanical key 680 could be inserted to rotate a cylindrical plug 640 and move elements of the mechanical lock module 630 from a locked position to an unlocked position, and vice versa. It should be understood that the mechanical lock module 630 could be any type of a lock module capable of being understood by anyone skilled in the art, including but not limited to:

(a) A mechanical lock module that uses a mechanical key;
(b) A mechanical lock module that uses a combination lock; and
(c) A mechanical lock module that uses a key and/or a combination lock in combination with another locking method such as an electromagnetic actuator, and/or an electronic sensor/transducer.

FIG. 10A, FIG. 10B, and FIG. 11 show that the electronic module 610 comprises an electronic lock module shaft, shown at 616. A portion of the shaft 616 is inserted into a cavity 632 in the mechanical lock module 630 when the lock 600 is in locked configuration (the configuration shown in FIG. 10A and FIG. 10B). The electronic module shaft 616 is fully removed from the mechanical lock module 630 when the lock 600 is in an unlocked configuration (a configuration shown in FIG. 11). The electronic module shaft 616 comprises a retaining feature, shown at 618. The electronic module shaft retaining feature 618 is used to secure the shaft 616 into the mechanical lock module 630 when the lock 600 is in a locked configuration. The electronic module shaft 616 can be any shape capable of being understood by anyone skilled in the art, including but not limited to a cylindrical shape, a rectangular shape, a hexagonal extruded shape, and an octagonal extruded shape. The retaining feature 618 can be any mechanical feature for retaining a mechanical assembly onto a shaft capable of being understood by anyone skilled in the art, including but not limited to a circular groove in a cylindrical shaft, a groove in a rectangular, hexagonal, or octagonal shaft, a notch, and a protrusion. The electronic module shaft 616 can be made of any material capable of being understood by anyone skilled in the art including, but not limited to various alloys of steel, aluminum, titanium, and ceramics. In one embodiment, the shaft comprises a non-magnetic hollow stainless-steel cylinder. The electronic module shaft 616 can also undergo a heat treatment or case-hardening process to improve the ability for the lock to be broken or cut.

Figure 12A:
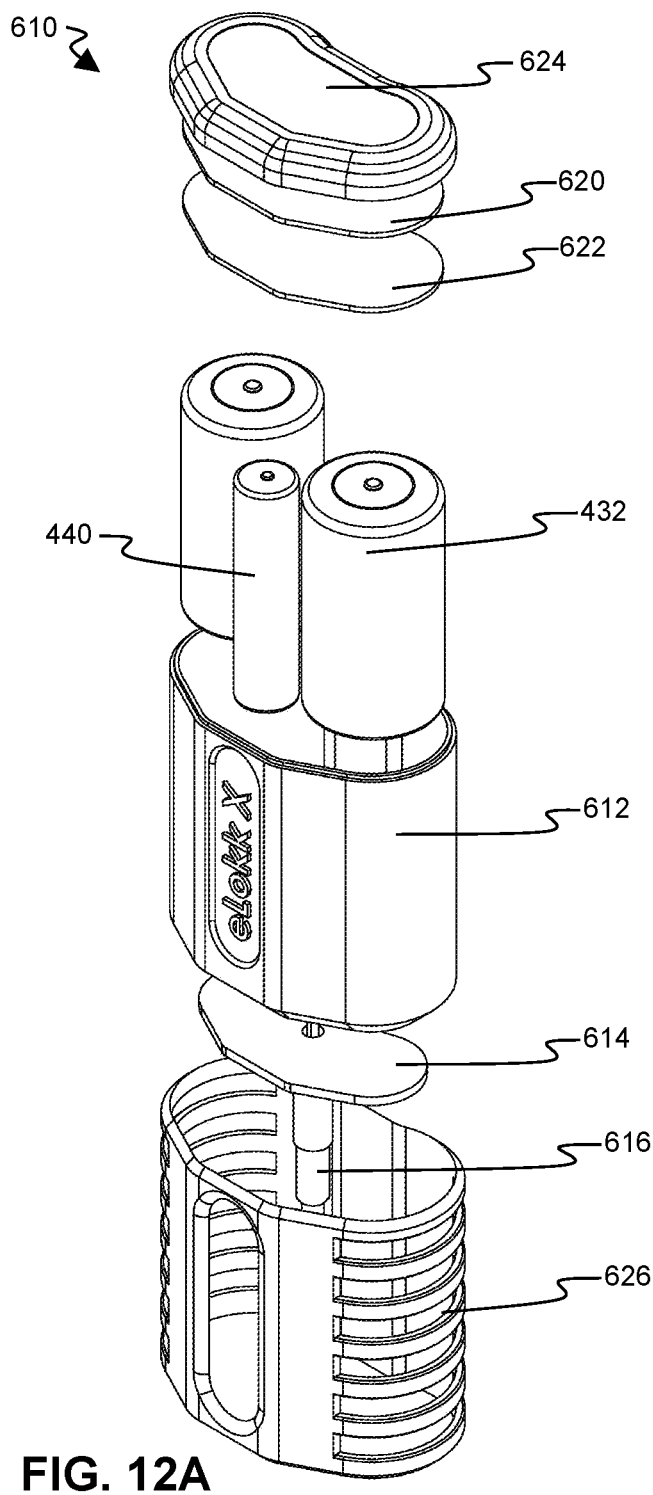
FIG. 12A is an isometric exploded view of the electronic module shown in FIG. 10A, FIG. 10B.

FIG. 12A shows an exploded isometric view of the electronic module 610 shown previously. In the embodiment shown in FIG. 12A, the electronic module shaft 616, is securely attached to an electronic module case bottom 614. An electronic module main shell 612 attaches to the electronic module case bottom and houses the batteries 432 and 440 that were previously described with reference to FIG. 8. The electronic module 610 comprises one or more circuit boards, shown at 620 and 622, that hold the circuitry that was described with reference to FIG. 5 and FIG. 8. In the embodiment shown in FIG. 12A, the first circuit board 620, second circuit board 622, non-rechargeable high capacity battery 440, and rechargeable battery 432 are held within the volume that is inside the assembled electronic module case bottom 614, electronic module main shell 612, and an electronic module top cover 624. The electronic module case bottom 614, electronic module main shell 612, and electronic module top cover 624 could be made of any material capable of being understood by anyone skilled in the art including metals and plastics. There can be an electronic module rubber sleeve 626 around the outside of the electronic module main shell 612.

Figure 12B:
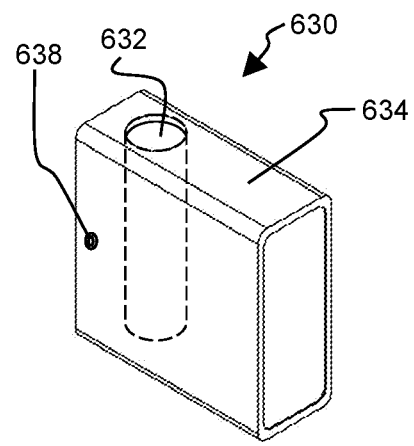
FIG. 12B is an isometric view of the mechanical lock module of FIG. 10A, FIG. 10B, FIG. 10C, and FIG. 11.

FIG. 12B is an isometric view of the mechanical lock module 630 that was shown previously. This drawing illustrates that in one embodiment, the mechanical lock module comprises a mechanical lock module case, shown at 634, and a set screw, shown at 638. The mechanical lock module case 634 is shown by itself in FIG. 12C. FIG. 12D gives an outline view the of the mechanical lock body internal parts 636 that are held inside the mechanical lock body case 634 when the case has been slid over the internal parts 636 and the set screw 638 has been fasted to prevent the case from sliding relative to the internal parts 636. The mechanical lock module case 634 is typically made of a hardened steel material to ensure that the lock module 630 cannot easily be broken by impact or other means used to physically destroy a lock.

Figure 12C:
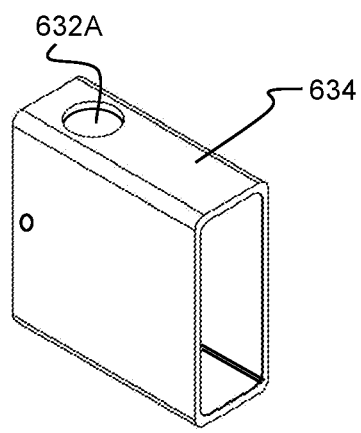
FIG. 12C is an isometric view of the case for the mechanical lock module of FIG. 12B.
Figure 12D:
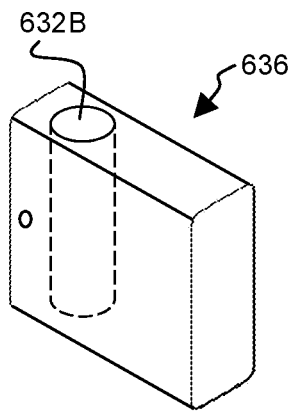
FIG. 12D is an isometric view of the body of the mechanical lock module of FIG. 12B.

Further referring to FIG. 12B, FIG. 12C, and FIG. 12D, the mechanical lock module cavity 632 comprises an aperture 632A in the top of the mechanical lock body case and a cavity 632B in the mechanical lock body internal parts. When the electronic module shaft (616 in FIG. 10A, FIG. 10B, FIG. 11, and FIG. 12A) is inserted through the mechanical lock body case aperture 632A at least far enough so that a portion of the shaft 616 is inside the cavity 632B in the mechanical lock body internal parts 636, the shaft 616 will also prevent the case 634 from sliding relative to the mechanical lock body internal parts 636.

Figure 13A:
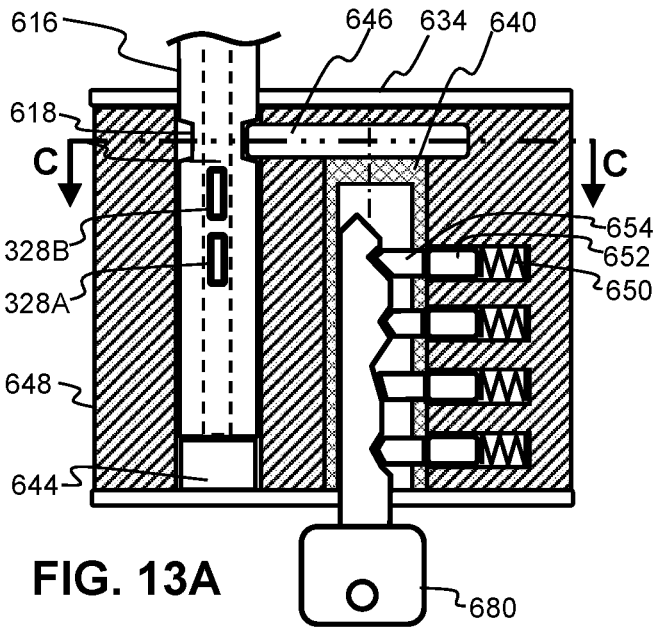
FIG. 13A shows Section A-A of FIG. 10A.
Figure 13B:
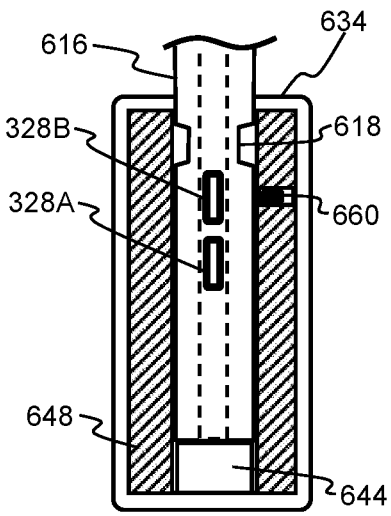
FIG. 13B shows Section B-B of FIG. 10B.
Figure 13C:
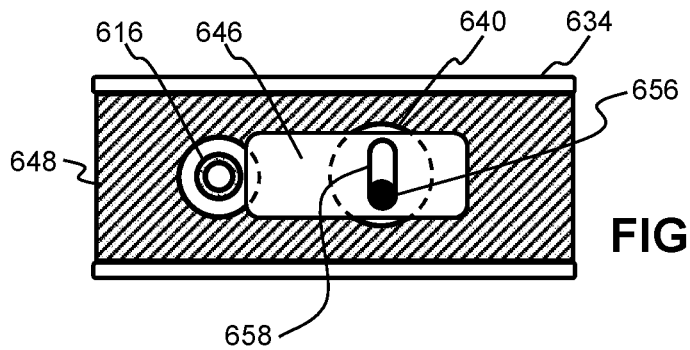
FIG. 13C shows Section C-C of FIG. 13A.

FIG. 13A shows Section A-A of FIG. 10A and FIG. 13B shows Section B-B of FIG. 10B. FIG. 13C shows Section C-C of FIG. 13A. These three drawings help illustrate and describe the functionality of the mechanical lock module 630 in FIG. 10A and FIG. 10B and the interactions of the mechanical lock module 630 with the mechanical key 680 and electronic module shaft 616. In FIG. 13A, FIG. 13B, and FIG. 13C, a portion of the electronic module shaft 616 is held in the cavity (632 in FIG. 11 and FIG. 12B) of the mechanical lock module (630 in FIG. 11 and FIG. 12B). In one embodiment, the main components of the mechanical lock module 630 are held by a mechanical lock module frame 648, which is held inside of the mechanical lock module case 634 by a set screw. The use of a set screw to secure the mechanical module case was described with reference to FIG. 12B. The electronic module shaft 616 is secured inside the cavity 632 by a locking plate, shown at 646 in FIG. 13A and FIG. 13C, because the locking plate 646 engages with the shaft retaining feature, shown at 618 in FIG. 13A. In the embodiment shown, the retaining feature 618 is a circular groove in the hollow cylindrical shaft 616. The locking plate 646 can be moved right and left in the view shown in FIG. 13A and FIG. 13B by using the mechanical key 680 to rotate the cylindrical plug, shown at 640. In the embodiment shown in FIG. 13A and FIG. 13C, the cylindrical plug 640 is a cylindrical assembly that can be rotated about a vertical axis and the cylindrical plug 640 comprises a locking plate engagement pin, shown at 656 in FIG. 13C that is located at the top of the cylindrical plug 640. The locking plate engagement pin 656 engages with a slot 658 in the locking plate 646 to move the locking plate 646 right and left in the view shown in FIG. 13A, which causes a portion of the locking plate 646 to move into and out of the shaft retaining feature region and lock and unlock the shaft 616. For embodiments of the present invention, the mechanism used to secure and release the shaft 616 inside the mechanical lock module 630 is not limited to the example shown here. The mechanism used to secure and release the shaft 616 inside the mechanical lock module 630 can be any mechanism capable of being understood by a person skilled in the art of designing mechanical locks.

FIG. 13A shows a tumbler lock mechanism in which the cylindrical plug 640 can only rotate if a mechanical key 680 is inserted into the cylindrical plug 640 and the mechanical key 680 has the correct profile for a plurality of key pins, shown at 654, each of which is pushed by a spring 650 and a driver pin 652, to align to the correct depths. If this alignment is correct, the cylindrical plug 640 can be rotated by the mechanical key 680 which causes the locking plate eccentric pin 656 in FIG. 13C to rotate, which causes a linear movement of the locking plate 646. When the electronic module shaft 616 is not secured by the locking plate 646, the shaft 616 can be removed from the mechanical lock module, 630 in FIG. 11 and FIG. 12B. When the mechanical lock module 630 is unlocked and the shaft 616 is inserted, the maximum depth of insertion can be set by using a stop pin, shown at 644 in FIG. 13A and FIG. 13B. The use of a stop pin 644 facilitates the use of a standard mechanical lock module 630 with a shaft 616 having its retaining feature 618 at a specific distance from the end of the shaft 616.

FIG. 13A and FIG. 13B also illustrate the location of magnetic field sensors, shown at 328A and 328B inside electronic module shaft 616. These magnetic field sensors 328 were previously described with reference to the system diagram shown in FIG. 5. The magnetic field sensors 328A and 328B are electrically coupled with the circuit boards shown at 620 and 622 in FIG. 12A. When the magnetic field sensors 328A and 328B are proximate to a magnet, such as the lock module magnet 660 shown in FIG. 13A, a signal is generated which can be interpreted by an electronic processing module in the system and used to determine the position of the shaft 616 in the mechanical lock module 630. The lock module magnet 660 shown in FIG. 13B is mounted in the mechanical lock module frame 648 in an orientation in which one of the poles of the lock module magnet 600 will align with the upper magnetic field sensor 328B when the electronic module shaft 616 is fully inserted into the mechanical lock module 630. The lock module magnet 660 aligns with the lower magnetic field sensor when the shaft 616 is partially inserted into the mechanical lock module.

The magnetic field sensors 328 used in embodiments of this invention can be any type of magnetic field sensors capable of being understood by anyone skilled in the art, including but not limited to:
  (a) Magnetically-actuated reed switches;
  (b) Hall effect sensors;
  (c) Electro-magnetic coils; and
  (d) Magneto-resistive sensors, which can include ordinary magnetoresistance (OMR) sensors, anisotropic magnetoresistance (AMR) sensors, tunneling magnetoresistance (TMR) sensors, spin Hall magnetoresistance (SMR) sensors, giant magnetoresistance (GMR) sensors, colossal magnetoresistance (CMR) sensors, Hanle magnetoresistance (HMR) sensors, and non-local magnetoresistance (NMR) sensors.

The magnetic field sensors 328 can be used to generate an analog (continuously varying) signal or a digital (on/off or switch closed/switch open) signal. In one embodiment, the magnetic field sensors are magnet Reed switches that are off when no magnetic field is present and on when a magnetic field is present. Such magnetic Reed switches have the benefit of being a proven technology that is reliable and available for a low cost.

Figure 13D:
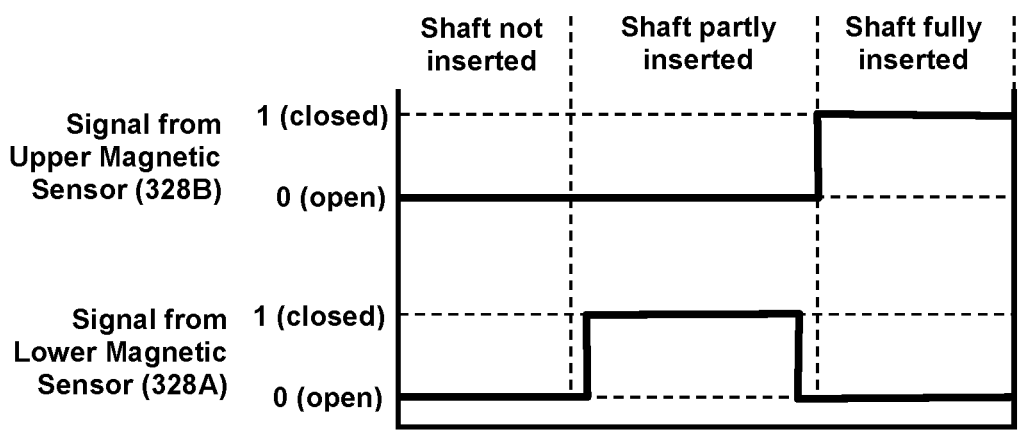
FIG. 13D is an example of an output signal generated by the magnetic field sensors shown in FIG. 13A and FIG. 13B as these sensors pass by the magnet shown in FIG. 13B during the insertion of a portion of the electronic module shaft into the mechanical lock module cavity.

FIG. 13D is an example of an output signal generated by the magnetic field sensors, 328A and 328B shown in FIG. 13A and FIG. 13B, as these magnetic field sensors pass by the mechanical lock module magnet, 660 shown in FIG. 13B, as the portion of the electronic module shaft, 616 in FIG. 13A and FIG. 13B, is inserted into the mechanical lock module cavity, 632 in FIG. 12B. The top graph section of FIG. 13D shows the signal generated by the upper magnetic sensor, 328B in FIG. 13A and FIG. 13B, as a function of shaft insertion depth and the bottom graph section of FIG. 13D shows the signal generated by the lower magnetic sensor, 328A in FIG. 13A and FIG. 13B as a function of shaft insertion depth. The output shown in FIG. 13D is a typical output from magnetic field sensors that are magnetic Reed switches. The following is a state table relating shaft insertion position to the outputs of the two magnetic sensors:

| Signal from Lower Magnetic Sensor (328A) | Signal from Upper Magnetic Sensor (328B) | System State |
| --- | --- | --- |
| Low (no magnetic field detected) | Low (no magnetic field detected) | Shaft not inserted into mechanical lock module |
| High (magnetic field detected) | Low (no magnet field detected) | Shaft partly inserted into mechanical lock module |
| Low (no magnet detected) | High (magnetic field detected) | Shaft fully inserted into mechanical lock module |
| High (magnetic field detected) | High (magnetic field detected) | Error. There is something not correct about the system |

The above state table illustrates how the magnetic field sensors, 328A and 328B, and lock module magnet 660 can be used in embodiments of the present invention to monitor the locking process and unlocking processes as well as continuously monitoring that the lock system is operating correctly. During the locking process, the lower magnetic sensor must go from low to high and back to low. The first time when the lower magnetic sensor is low, the upper magnetic sensor must also be low. The second time when the lower magnetic sensor is low, the upper magnetic sensor must be high. When the system is locked, the lower magnetic sensor must always be low and the upper magnetic sensor must always be high. During the unlocking process, the lower magnetic sensor must go from low to high and back to low. The upper magnetic sensor must be high when the unlocking process is initiated and the lower magnetic sensor is low. The upper magnetic sensor must be low when the lower magnetic sensor goes low and the unlocking process is complete. If any of these sequences are not followed, or if at any time, both magnetic sensors go high, an alarm can be set and communicated.

The use of a minimum of one lock module magnet 660 and a minimum of two magnetic field sensors, 328A and 328B, in the configuration shown in FIG. 13A, FIG. 13B, and FIG. 13C and connected to a processor a wireless communication system, as described with reference to FIG. 5 creates a system that cannot be broken into by mounting a powerful magnet outside of the lock system to fool a magnetic field sensor 628 into detecting a magnetic field normally associated with a lock module magnet 660 when the mechanical lock module 630 has been removed from the electronic module shaft 616. Another key feature of the system illustrated in this disclosure is that the mechanical lock module is a totally passive module. It has no electronics in it. All active electronic components are in the electronic module 610.

Figure 14A:
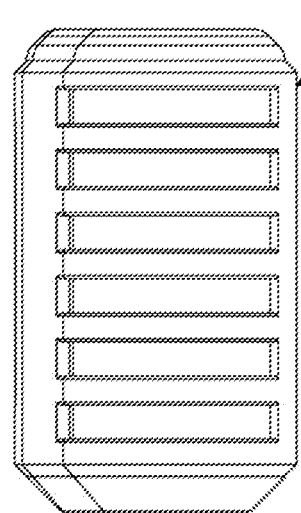
FIG. 14A is an end schematic view of the lock module and electronic module shown in the previous figures when the shaft is not inserted into the lock module.
Figure 14B:
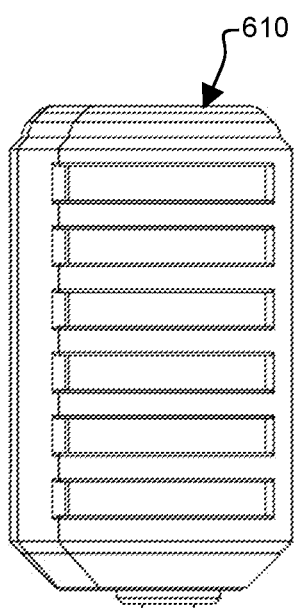
FIG. 14B is an end schematic view of the lock module and shaft module of FIG. 14A when a portion of the shaft is partly inserted into the lock module cavity.
Figure 14C:
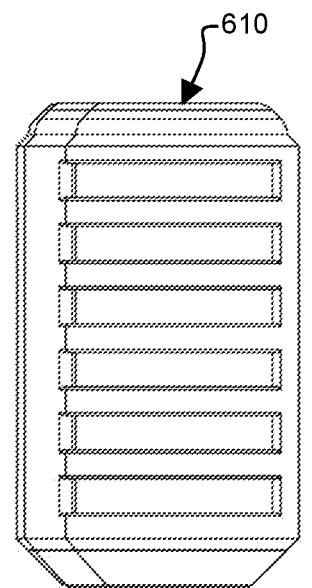
FIG. 14C is an end schematic view of the lock module and shaft module of FIG. 14A when and 14B when the shaft portion is fully inserted into the lock module cavity.

FIG. 14A, FIG. 14B, and FIG. 14C schematically show three positions for the electronic module relative to the mechanical lock module. FIG. 14A is an end schematic view of the electronic module 610 and the mechanical lock module 630 where the electronic module shaft 616 is not inserted into the mechanical lock module 630. This is the state when both the upper magnetic field sensor 328B and the lower magnetic field sensor 328B do not detect the lock module magnet 660 (i.e. the left region of the graph in FIG. 13D). FIG. 14B is an end schematic view of the electronic module 610 and the mechanical lock module 630 where the electronic module shaft 616 is partly inserted into the mechanical lock module 630 in a position where the lower magnetic field sensor 328A detects the lock module magnet 660 and the upper magnetic field sensor 328A does not detect the lock module magnet 660 (i.e. the center region of the graph in FIG. 13D). FIG. 14C is an end schematic view of the electronic module 610 and the mechanical lock module 630 where the electronic module shaft 616 is fully inserted into the mechanical lock module 630 in a position where the lower magnetic field sensor 328A does not detect the lock module magnet 660 and the upper magnetic field sensor 328A does detect the lock module magnet 660 (i.e. the right region of the graph in FIG. 13D).

Additional magnets and sensors can be added to the lock system to make it even more secure and tamper-proof. By placing the magnets at different positions, it is also possible to ensure that a specific electronic module must be mated with a specific mechanical lock module. For example, the system shown in FIG. 15A, FIG. 15B, FIG. 15C, and FIG. 15D comprises three lock module magnets 660A, 660B, and 660C that are located at different positions in an alternate embodiment lock module 631A so that the magnets 660A, 660B, and 660C, will be detected by magnetic field sensors at different insertion positions for the electronic module shaft 616. The alternate embodiment electronic module 611A shown in FIG. 15A, FIG. 15B, FIG. 15C, and FIG. 15D has four magnetic field sensors 328A, 328B, 328C, and 328D that are located at various positions inside the length of the shaft 616. FIG. 15A is an end schematic view of this alternate embodiment mechanical lock module 631A having three magnets, 660A, 660B, and 660C and the alternate embodiment electronic module 611A having four magnetic field sensors, 628A, 628B, 628C, and 628D with the shaft 616 not inserted into the lock module 631A. FIG. 15B shows the alternate embodiment lock module 631A and the alternate embodiment electronic module 611A of FIG. 15A with the shaft 616 partly inserted into lock module 631A at a position where the top magnet 660A is detected by the bottom magnetic field sensor 328A in the shaft 616. FIG. 15C shows the lock module 631A and electronic module 611A of FIG. 15A with the shaft 616 inserted into lock module 631A at a position where the top magnet 660A is detected by the second from the top magnetic field sensor 328C. FIG. 15D shows the lock module 631A and electronic module 611A of FIG. 15A when the shaft is fully inserted.

The magnets can have different field strengths and the sensors can be analog magnetic field sensors to make the lock system even more secure and tamper-proof. For example, FIG. 16A, FIG. 16B, FIG. 16C, FIG. 16D, and FIG. 16E illustrate a second alternate embodiment locking system in which there are four analog magnetic field sensors that can detect magnetic field strength, 628A, 628B, 628C, and 628D and four alternate lock module magnets 661A, 661B, 661C, and 661D, that have differing magnetic field strengths, as indicated by the diameters of the circles for these magnets. The systems shown in FIG. 16A, FIG. 16B, FIG. 16C, and FIG. 16D is configured to convert these different magnetic fields strengths to analog electrical values. In FIG. 16A, this system is illustrated with the shaft 616 of the second alternate embodiment electronic module 611B not inserted into the second alternate embodiment lock module 631B. In FIG. 16B, this system is illustrated with the shaft 616 inserted so that the bottom sensor can read the top magnet. In FIG. 16C, this system is illustrated with the shaft inserted so that the second from the top sensor can read the top magnet. In FIG. 16D, this system is illustrated with the shaft fully inserted.

FIG. 16E shows a graph of the magnetic field strength of the four alternate lock module magnets 661A, 661B, 661C, and 661D of FIG. 16D as these magnetic field strengths are detected by the four sensors, 628A, 628B, 628C, and 628C when the shaft 616 of the second alternate embodiment electronic module 611B is inside the second alternate embodiment lock module in the position shown in FIG. 16D. It can be appreciated from this graph that the profile being read by the four analog magnetic field sensors looks analogous to the profile on a typical key used in a lock. This illustrates that the use of multiple magnets with multiple field strengths in conjunction with multiple magnetic field sensors capable of reading analog values can be used to "key" the mechanical lock modules to specific electronic modules.

One way of summarizing some of the functionality and of the magnet(s) and sensors systems illustrated in FIG. 13A through FIG. 16E is as follows:
- The electronic module 610 comprises a shaft 616 made of a non-magnetic material, typically stainless steel;
- The electronic module shaft 616 is hollow, so a plurality of magnetic field sensors 328 can be placed into the center of the shaft at various points along the length of the shaft;
- The mechanical lock module 630 comprises at least one magnet 660;
- When the shaft 616 is inserted into the mechanical lock module 630, each magnetic field sensor will detect the magnet (or each magnet) at specific positions of insertion of the shaft 616 into a cavity 632 of the mechanical lock module 630;
- The signals from the magnetic field sensors can be used to determine a variety of conditions related to the lock system.

Among the conditions of the lock system that the magnetic field sensors can detect and wirelessly communicate can include:
- (a) Interruptions in any of the signals indicating a fault with any part of the system;
- (b) A condition indicative of an attempt to fool the lock; and
- (c) An incorrect combination of an electronic module 610 and mechanical lock module 630.

Figure 17:
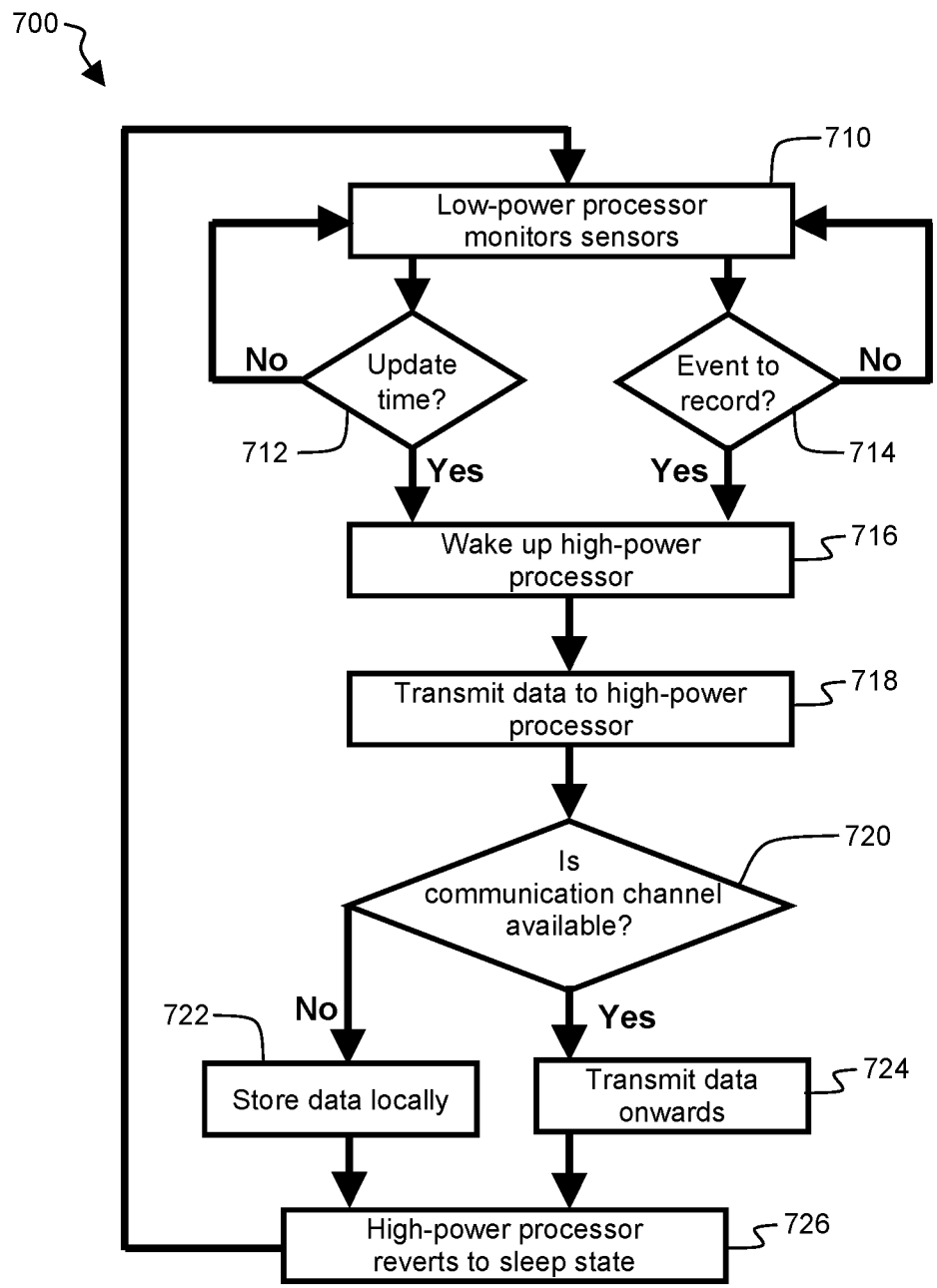
FIG. 17 is a process flow chart for how a low-power processor and high-power processor that can be used to minimize energy consumption for an electronic tracking device.

FIG. 17 shows a process for using a low power processor to minimize energy consumption for an electronic tracking device 700. The power minimization process uses a low power processor to monitor sensors as shown at 710. As long as a pre-determined update time is not reached, as shown at 712, or an event occurs that needs to be recorded, as shown at 712, the high-power processor stays asleep. When it is time to update the information 712 or there is an event to record, the high-power processor is woken up, as shown at 716. This allows data to be transmitted to the high-power processor, as shown at 718. Next, a decision needs to be made based on whether a communication channel is available, a step shown at 720. This communication channel could be a cellular communication channel, it could be an inter-device (e.g. mesh network communication channel as was described with reference to FIG. 6), it could be a WiFi communication channel, and/or it could be any other communication channel based on any other communication method or protocol described herein or capable of being understood by anyone skilled in the art. If no communication channel is available, data is stored locally, as shown at 722. If a communication channel is available, data is transmitted onwards, as shown at 724. Once data has either been stored locally 722 or transmitted onwards 724, the high-power processor can revert to a low power consuming sleep mode, as shown at 726.

The use of "dead reckoning" to determine the position of a device when other positioning information is not available requires the system to (a) start calculating from a known position, (b) use acceleration information as a function of time to determine velocity information as a function of time, and (c) use the velocity information as a function of time and the known position information to determine position information for the device as a function of time. This velocity information can come from the IMU. It can also be supplemented with velocity information from the vehicle. Since the acceleration information from the inertial measurement unit (IMU) can be noisy, it is important to try to use redundancy and noise filtering technologies to improve the accuracy of the system. Embodiments of the present invention can use a Kalman filter, a Madgwick filter, and/or a Mahony filter as well as redundant IMUs to help improve the accuracy of the position information calculated using "dead reckoning".

Fusion filters such as those attributed to Mahoney, Madgwick and Kalman, can use Euler angles or quaternions for coordinate transformations. The Euler angle representation is sometimes called a 3-2-1-rotation sequence of yaw (or heading), pitch, and roll. Using Euler angles, the position of a point in space can be determined using a spherical coordinate system. A spherical coordinate system permits the user to identify any point in space from two tilt angles and one radial distance. The tilt angles, pitch and roll, captured from an inertial sensor (such as an accelerometer, gyroscope, and/or magnetometer) can be used respectively as Alpha and Beta angles of the spherical coordinate system as illustrated in the equations below. Orientation can be captured by measuring the projection of the static gravity on a tilted accelerometer (or other type of inertial sensor). Radial distance R can be measured using a linear measurement from an accelerometer. Combining orientation and radius, the instantaneous position of an object in an inertial frame can be expressed as a function of the time-varying radius and spherical angles (Euler angle transformation).

$X = R(t) \cdot \text{Cos}(\alpha) \cdot \text{Sin}(\beta)$ $Y = R(t) \cdot \text{Sin}(\alpha) \cdot \text{Sin}(\beta)$ $Z = R(t) \cdot \text{Cos}(\beta)$ It is important to distinguish between the inertial frame and the user frames. The inertial frame is considered as a reference and all objects in the 3D virtual environment are expressed with respect to it. Thus, the inertial frame is fixed. The x-axis is pointing to any convenient direction, the z-axis is pointing vertically upward and the y-axis is perpendicular to both. The user frame is the moveable system containing the pointer. It is defined by a rotation around the z-axis by $\psi$ and by the rotation around x and y by $\theta$ and $\Phi$. Moreover, the distance between those frames defines the offset of the pointer with respect to the inertial frame. The figure below illustrates those rotations (Euler angle transformations). The matrix linking between those two frames is the product of the following rotation matrix.

$$R = e^{(\hat{z} \times)\psi} e^{(\hat{y} \times)\theta} e^{(\hat{x} \times)\phi} = \begin{bmatrix} \cos(\psi) & -\sin(\psi) & 0 \\ \sin(\psi) & \cos(\psi) & 0 \\ 0 & 0 & 1 \end{bmatrix} \cdot$$

$$\begin{bmatrix} \cos(\theta) & 0 & \sin(\theta) \\ 0 & 1 & 0 \\ -\sin(\theta) & 0 & \cos(\theta) \end{bmatrix} \cdot \begin{bmatrix} 1 & 0 & 0 \\ 0 & \cos(\varphi) & -\sin(\varphi) \\ 0 & \sin(\varphi) & \cos(\varphi) \end{bmatrix}$$

After developing we get:

$$R_{IB} = \begin{bmatrix} \cos(\psi) \cdot \cos(\theta) & \cos(\psi) \cdot \sin(\theta) \cdot \sin(\varphi) - \sin(\psi) \cdot \cos(\varphi) & \cos(\psi) \cdot \sin(\theta) \cdot \cos(\varphi) - \sin(\psi) \cdot \sin(\varphi) \\ \sin(\psi) \cdot \cos(\theta) & \sin(\psi) \cdot \sin(\theta) \cdot \sin(\varphi) - \cos(\psi) \cdot \cos(\varphi) & \sin(\psi) \cdot \sin(\theta) \cdot \cos(\varphi) - \cos(\psi) \cdot \sin(\varphi) \\ -\sin(\theta) & \cos(\theta) \cdot \sin(\varphi) & \cos(\theta) \cdot \cos(\varphi) \end{bmatrix}$$

In comparison, a quaternion is an abstract means for representing a change or reference frames as a four-dimensional vector to describe a three-dimensional change in orientation (or attitude). Although the Euler angle representations of attitude, is quite intuitive as a three-dimensional vector representing a three-dimensional attitude, it suffers from an inherent problem with its attitude representation. There are two attitudes (90 degrees and 270 degrees) where a singularity occurs in which case the yaw and the roll would perform the same operations. This "gimbal lock" issue could be quite problematic in the control of a body when dealing with angles close to the singularity points. A quaternion attitude representation can be used to provide a full description of an orientation without the need for handling the Euler angle singularities computationally. There are several other advantages to using a quaternion attitude representation over Euler angles. One of these advantages is that the use of quaternions is that no trigonometric functions need to be solved, as is the case when using Euler angles. Trigonometric functions are computationally expensive to solve and can slow down the control look. Small angle approximations can be used for orientation changes of less than 5 degrees, but this can create other issues. Quaternions require a single trigonometric calculation only when a non-zero yaw angle is included in the orientations. Otherwise, quaternion calculations are solely algebraic and computationally inexpensive. It is also simpler to smoothly interpolate between two orientations when using quaternions rather than Euler angles. However, converting a quaternion orientation into a usable pitch, roll, and yaw orientation does require an extra algebraic transformation that is not needed when using Euler angles.

Quaternions get around the "gimbal lock" problem by over defining an attitude representation through the addition of an additional degree not included when calculating Euler transformations. Like Euler angles, quaternions are based on Euler's concept that: "A rigid body or coordinate reference frame can be brought from an arbitrary initial orientation to an arbitrary final orientation by a single rigid body rotation through a principal angle Φ about the principal axis; the principal axis is a judicious axis fixed in both initial and final orientation." This principle means that any arbitrary orientation could be represented with just a unit vector and an angle where the unit vector (r) defines the direction of rotation and the angle (θ) being the amount of rotation about the direction's axis to reach a final attitude from an initial one. The quaternion approach is based upon this principle and can be derived from the principal axis (r) and principal angle (θ). A quaternion is a 4-dimensional hyper-complex number. The three complex parts, denoted as I, j, and k are interrelated by the following equations:

$i2=j2=k2=1$ $ij=k=ji$ $jk=i=kj$ $ki=j=ik$

While different papers on the subject use different ordering of the terms, all quaternions fundamentally represent the same thing. Hence, a quaternion could be used to represent the orientation of a rigid body or coordinate frame in three-dimensional space where an arbitrary rotation of a give frame B relative to a given frame A can be achieved through a rotation (θ) around an axis (r) defined in frame A. We can use Madgwick's $$^A_B\hat{q} = [q_0\ q_1\ q_2\ q_3] = \left[\cos\frac{\theta}{2}\ -r_x\sin\frac{\theta}{2}\ -r_y\sin\frac{\theta}{2}\ -r_z\sin\frac{\theta}{2}\right]$$

following equation describes a quaternion-based transformation where $^A_B\hat{q}$ is a quaternion representing the coordinate transformation and $^A_B\hat{q}$ is defined by the following equation: Where:
- $q_0$ is the scalar component of the quaternion and $q_1$, $q_2$, and $q_3$ represent the vector components of the quaternion. Note that quaternions can be written as a vector with 4-scalar components ($q_0$, $q_1$, $q_2$, and $q_3$), with components $q_1$, $q_2$, and $q_3$ corresponding to the distance along the quaternion basis vectors of i, j, and k. The $q_0$ component is considered the scalar part of the quaternion and $q_1$, $q_2$, and $q_3$ together form the vector part. Hence, another representation of the quaternion in the complex domain is $^A_B\hat{q}=q_0+q_1i+q_2j+q_3k$
- r is the axis of rotation in frame A and $r_x$, $r_y$, and $r_z$ are the axis components also the x, y and z axes
- θ is the angle of rotation around the axis r It is often useful to represent a quaternion rotation with an orthogonal matrix that, when post-multiplied by a column vector representing a point ins pace, results in the point rotated by the quaternion. This orthogonal matrix R is shown in the following equation:

$$^A_BR = \begin{bmatrix} 2q_0^2-1+2q_1^2 & 2(q_1q_2+q_0q_3) & 2(q_1q_3-q_0q_2) \\ 2(q_1q_2-q_0q_3) & 2q_0^2-1+2q_2^2 & 2(q_2q_3+q_0q_1) \\ 2(q_1q_3+q_0q_2) & 2(q_2q_3-q_0q_1) & 2q_0^2-1+2q_3^2 \end{bmatrix}$$

It is also useful to represent the Euler angles as a function of the quaternions. In an Euler angle representation of a transformation the ZYX Euler angles Φ, θ, and ψ, describe the orientation of frame B achieved by the sequential rotations from alignment with frame A, of ψ around the Z axis of Frame B, θ around the Y axis of Frame B, and Φ around the X axis of Frame B. Hence, the Euler angles can be calculated by the following equations using $$^A_B\hat{q} = [q_0\ q_1\ q_2\ q_3] = \left[\cos\frac{\theta}{2}\ -r_x\sin\frac{\theta}{2}\ -r_y\sin\frac{\theta}{2}\ -r_z\sin\frac{\theta}{2}\right]$$

$$\phi = \operatorname{atan2}(2(q_2q_3 - q_0q_1), 2q_0^2 - 1 + 2q_3^2)$$

$$\theta = -\arctan\left(\frac{2(q_1q_3 + q_0q_2)}{\sqrt{1-(2q_1q_3+q_0q_2)^2}}\right)$$

$$\psi = \operatorname{atan2}(2(q_1q_2 - q_0q_3), 2q_0^2 - 1 + 2q_1^2)$$

Figure 18A:
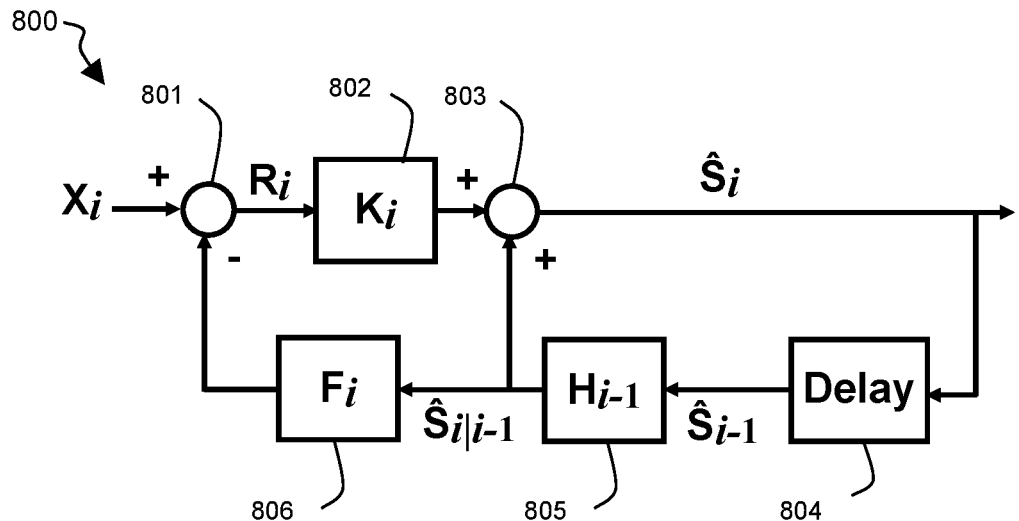
FIG. 18A shows a generalized Kalman filter.

FIG. 18A shows the main elements of a generalized Kalman filter, 800. A Kalman filter is a linear, unbiased, and minimum error variance recursive algorithm that optimally estimates the unknown state of a linear dynamic system from noisy data taken at discrete real-time intervals. Referring to FIG. 18A, the actual measurement Xi is compared with the predicted measurement from the prediction model 806, a step shown at 801. The measured difference between actual measurement Xi and the output from the prediction model 806 is called residual or innovation Ri. This residual Ri is multiplied by a Kalman filter gain in the step labeled 802. Step 802 can comprise a matrix multiplication. In the step labeled 803 the output of the Kalman gain computation is added to the system model output based on the previous estimate, a value shown as Ŝi|i+1. The result of the addition in step 803 is a new state estimate Ŝi. The new state estimate Ŝi is updated at discrete time intervals based on the length of the time interval delay 804. After this time delay, the most recent state estimate becomes Ŝi−1, and is called the previous state estimate. The previous state estimate Ŝi−1 is then fed through a system model 805 which results in a system model output based on the previous state estimate Ŝi|i−1. This system model transformation 805 can comprise a matrix multiplication. The system model output based on the previous estimate Ŝi|i−1 serves as the input for a prediction model transformation, shown at 806. The prediction model transformation 806 can also comprise a matrix multiplication. When using a Kalman filter for generating position and orientation information, coordinate transformations performed in the Kalman filter gain calculation 802, the system model transformation 805, and the prediction model transformation 806, can be performed using the Euler angle transformations or through the use of quaternions.

Figure 18B:
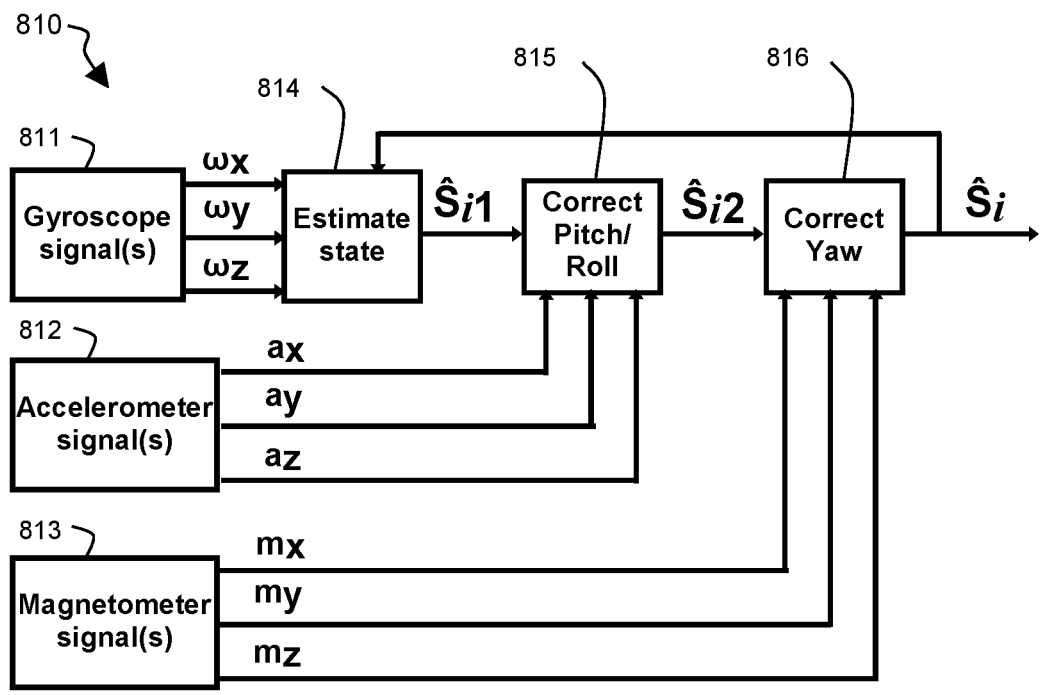
FIG. 18B shows an extended Kalman filter configured for use in an inertial measurement unit.

FIG. 18B shows the main elements of an extended Kalman filter 810 configured for use in an inertial measurement unit (IMU). In FIG. 18B there are three signals that come from a gyroscope 811 and used to estimate state 814, using a Kalman filter implementation similar to the generalized Kalman filter 800 shown in FIG. 18A. These three signals are labeled ωx, ωy, and ωz in FIG. 18B and represent the rate of change of rotation of the gyroscope about three mutually perpendicular (x, y, and z axes) in a Cartesian reference frame. The result of this first Kalman filter to estimate state 814, is a first state estimate Ŝi1. This first state estimate Ŝi1 can be combined with accelerometer orientation signals ax, ay, and az from the accelerometer 812. These three accelerometer orientation signals ax, ay, and az are rotation signals about the same three perpendicular axes as for the gyroscope. Combining ax, ay, and az with Ŝi1 in the second Kalman filter, shown at 815, results in a second state estimate Ŝi2, in which pitch and/or roll have been corrected. This second state estimate Ŝi2 can be combined with magnetometer orientation signals mx, my, and mz from the magnetometer 813. These three magnetometer orientation signals mx, my, and mz are rotation signals about the same three perpendicular axes as for the gyroscope and the accelerometer. Combining mx, my, and mz with Ŝi2 in the third Kalman filter, shown at 816, results in an output state estimate Ŝi, in which yaw has also been corrected. The resulting orientation state estimation can be made significantly more accurate using this extended Kalman filter and three different orientation signal inputs 811, 812, and 813, than a Kalman filter using only one input, as was illustrated in FIG. 18A.

Figure 19:
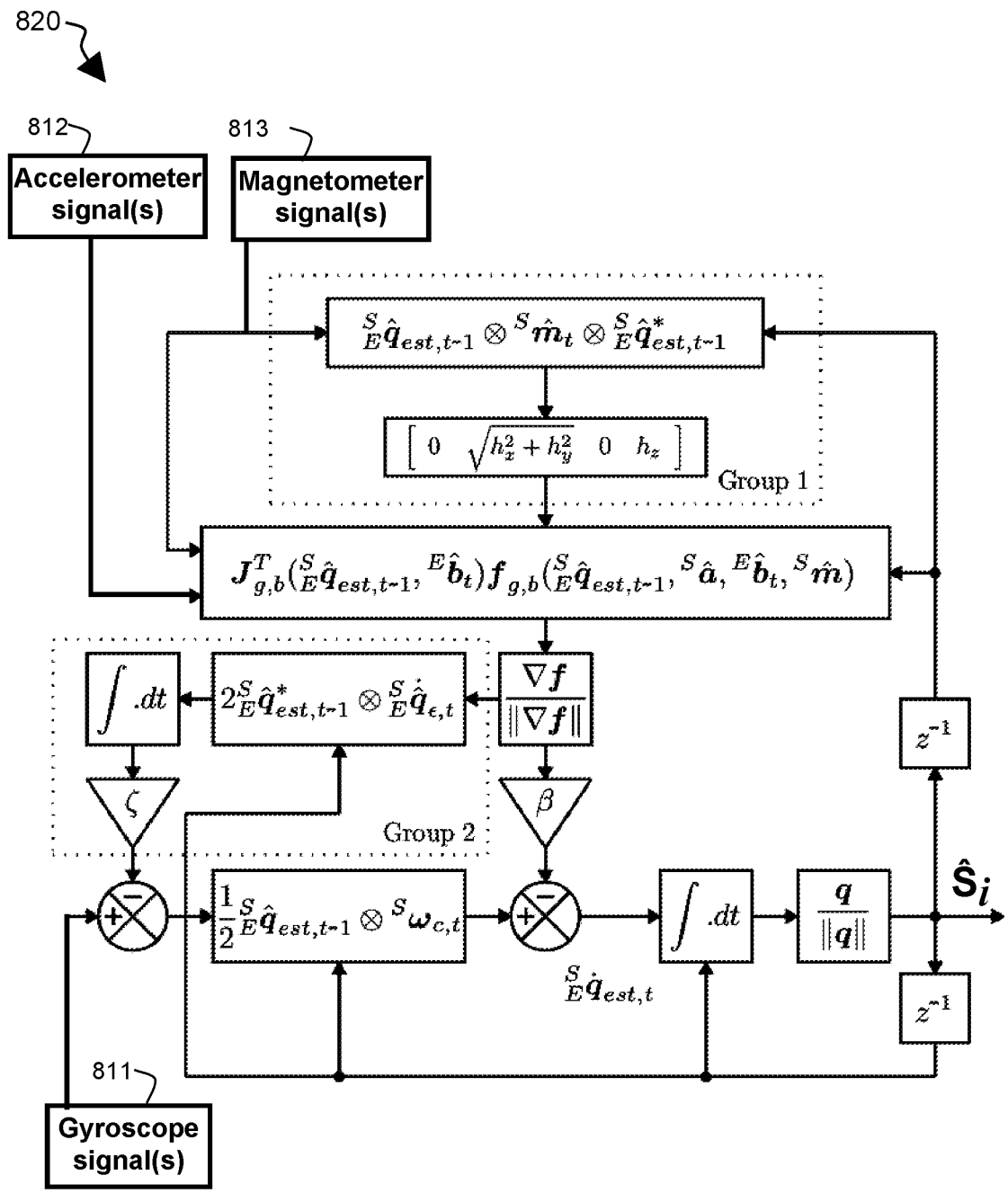
FIG. 19 shows a Madgwick filter using magnetometer, accelerometer, and gyroscope inputs (MAGI)

FIG. 19 shows the main elements of a Madgwick filter 820 used for an IMU. Referring to FIG. 19 the Madgwick filter 820 also uses orientation inputs from a gyroscope 811, a magnetometer 813, and an accelerometer 812 to generate the output state estimate Ŝi. The Madgwick filter calculates the orientation output Ŝi by numerically integrating the estimated orientation rates. The orientation output Ŝi is computed based on the rate of change of orientation measured by the gyroscope 811. The magnitude of the gyroscope measurement error is removed in the direction of the estimated error. This estimated error is computed from accelerometer measurements 812 and magnetometer measurements 813 using the equations shown in FIG. 19.

Figure 20A:
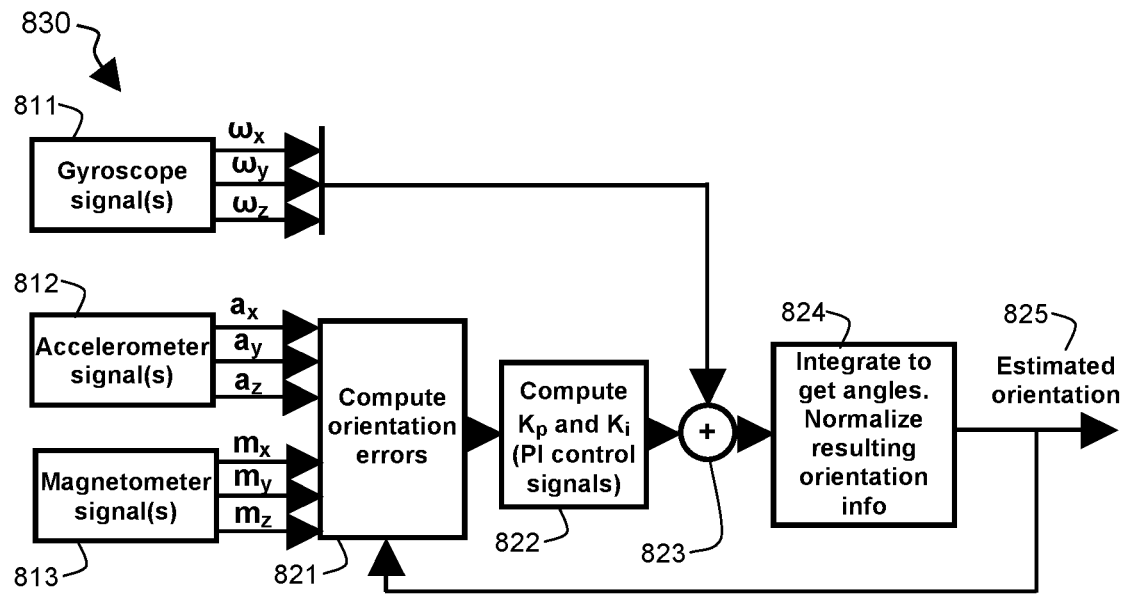
FIG. 20A and FIG. 20B show the main elements of a Mahony filter using magnetometer, accelerometer, and gyroscope inputs (MAGI)
Figure 20B:
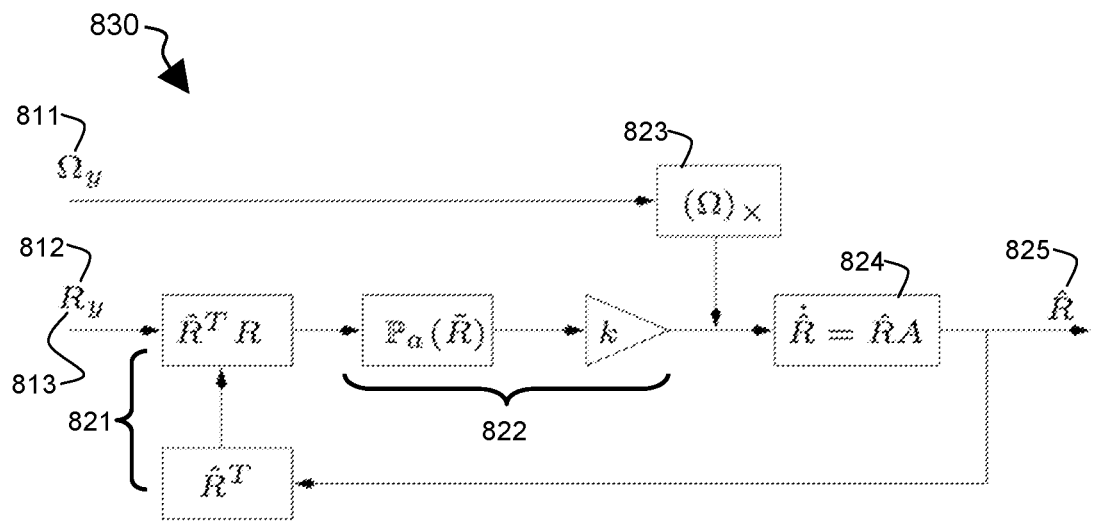

FIG. 20A and FIG. 20B show the main elements of a Mahony 830 filter. The Mahony filter is similar to the Madgwick filter 820 and can be implemented using Euler angles or quaternions. FIG. 20A provides an overview of one embodiment of a Mahony filter 820 using Euler angles x, y, and z from a gyroscope (ω, shown at 811), accelerometer (a, shown at 812) and magnetometer (m, shown at 813). These same signals are shown in FIG. 20B in a more generalized fashion as orientation matrices (which could be Euler angles or quaternions) from a gyroscope (Ω shown at 811) and an accelerometer and/or magnetometer (R, shown at 812/813). The first step of the process or system computes orientation errors by comparing the estimated orientation 825 with the signals for the orientation signals from the accelerometer 812 and/or magnetometer 813, a step shown at 821. These signals are then multiplied and integrated in the step shown at 822. This multiplication and integration is the same as the P (proportional) and I (integral) steps in a PID (proportional integral derivative) controller. In the case of a Mahony filter, the derivative information (i.e. angular rate change information) is provided by the gyroscope signals 811 and added to the PI information in the adder shown at 823. The resulting information is integrated and normalized, as shown in step 824, to get an improved estimated orientation 825. This process is repeated as new gyroscope 811, accelerometer 812, and/or magnetometer 813 signals are received.

Figure 21:
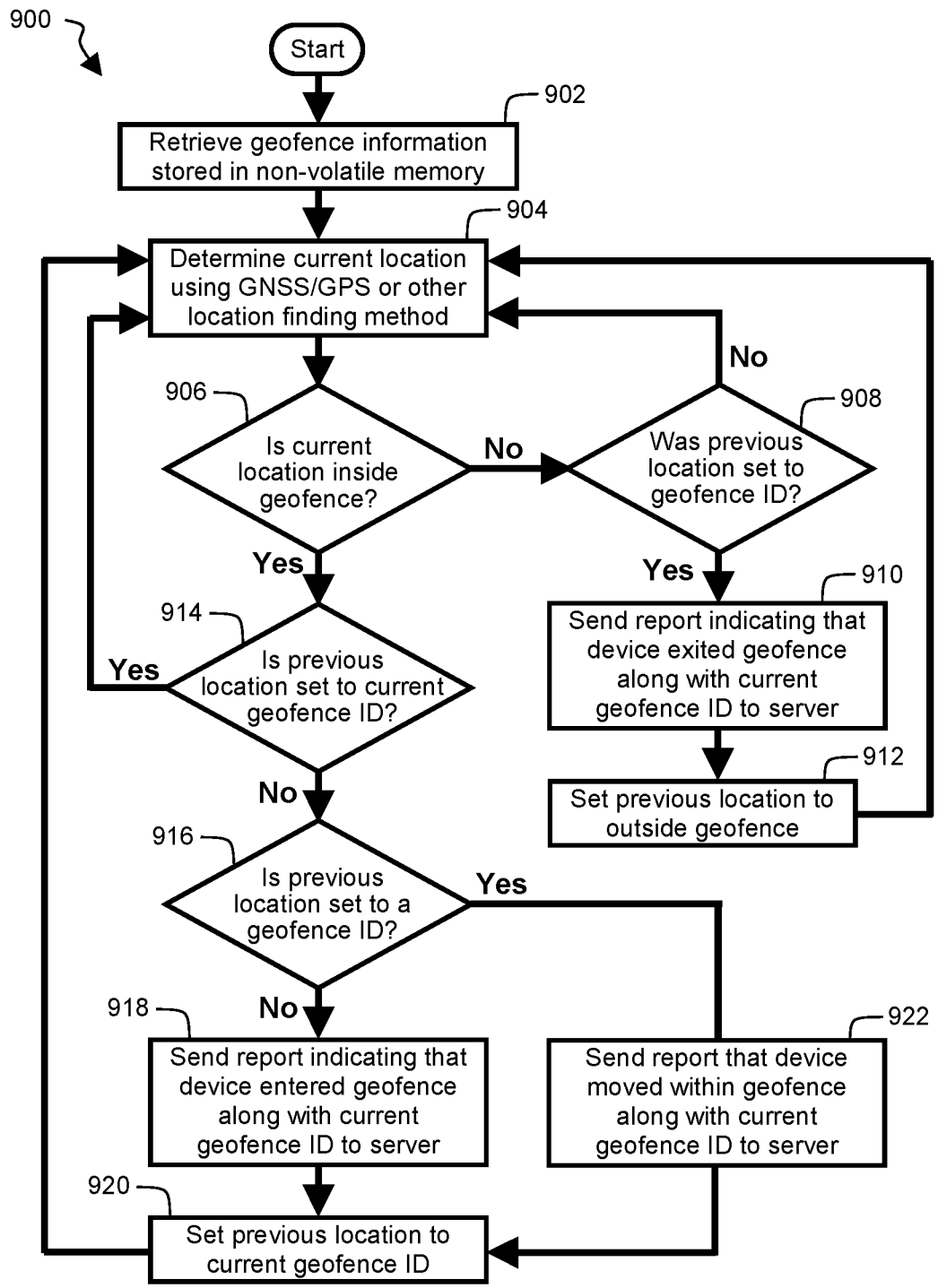
FIG. 21 shows a method for geofencing a movable freight container.

FIG. 21 shows a method for a geofencing a movable freight container (or other device) at 900 The method starts by retrieving geofence information from a non-volatile memory as shown at 902. This stored geofence information specifies the geographical boundaries within which the freight container should be located. The following table provides an example of the types of records and fields that may be used to store geofence information. to be within a virtual geographical "fence" that has been established for the freight container. The geofence information can comprise geofence identifiers (IDs) representing different subregions, locations, or zones within the geofence boundaries.

| Geo ID | Zone Type | Radius (meters) | Center Latitude | Center Longitude | Min Latitude | Max Latitude | Min Longitude | Max Longitude |
|---|---|---|---|---|---|---|---|---|
| Geo1 | 0 | 40 | 33.11982 | 35.44262 | 33.11946 | 33.12018 | 35.44219 | 35.44305 |
| Geo2 | 0 | 40 | 33.23110 | 35.40356 | 33.23074 | 33.23146 | 35.40313 | 35.40399 |
| Geo3 | 0 | 40 | 33.80846 | 35.59520 | 33.80810 | 33.80882 | 35.59477 | 35.59563 |
| Geo4 | 1 | 40 | 33.81237 | 35.62788 | 33.81201 | 33.81273 | 35.62744 | 35.62833 |
| Geo5 | 1 | 40 | 33.81252 | 35.62794 | 33.81216 | 33.81288 | 35.62750 | 35.62837 |

Referring to the geofence data table above, the Geo ID (also called a Geozone ID) is an identifier for a geofence record. The Zone Type field can be used to identify the shape of a geozone. In the table above, a zone type of "0" means that the zone is circular and a zone type of "1" means that the zone is rectangular. The Radius field identifies the maximum distance that an object can be away from the center of a geozone and still be in the geozone. In the example table above, this distance is given in meters. The center latitude and center longitude define the center point of the geozone. Min Latitude, Max Latitude, Min Longitude, and Max Longitude define the geographical boundaries of each geozone.

Referring again to FIG. 21, at step 904, the current location of the freight container (or other device) is determined using GNSS, GPS, or some other location finding method. Dead reckoning based on a previous location and motion information since the previous time is one example of an alternate location finding method. Getting location information from terrestrial-based transmitters in known locations using a technique described elsewhere in this document is another example. Next, at step 906, the current location is compared to the geofence information to determine whether the freight container (or other device) is inside the geofence, or physical boundaries of the virtual "fence". The area inside the geofence can also be called the geozone. There could also be multiple geozones with different IDs.

If the result of step 906 is "No", meaning that the current location of the freight container (or other device) is not within the boundaries of the geofence (i.e. not within the geozone or geozones), the method shown in FIG. 21 checks to see if the previous location that was recorded was within the geofence (within a geozone or geozones), a decision box shown at 908. If the result is "No", which means that the freight container (or other device) was outside of the geofence boundaries previously and still outside the geofence boundaries, the method goes back to step 904 to read the current location again, going around this loop until something changes.

If the result of step 908 is "Yes", meaning that the previous location of the freight container (or other device) was within the boundaries of the geofence (i.e. within a geozone or subregion within the geofence) and the current location is outside the boundaries of the geofence (i.e. not within a geozone or subregion within the geofence), a report is sent to a server (or other electronic information receiving apparatus external to this process) to indicate that the freight container (or other device) has exited the geofence boundaries (i.e. has left a geozone), a step shown at 910. In this case, the next step, shown at 912, is to set the previous location to outside the geofence. This condition can generate a geofencing alarm signal and this alarm signal can be transmitted immediately as an exception. The method then goes back to determining the current location, as shown at 904, and will follow the loop from 904 to 906 to 908 to 904 until the current location is inside the geofence boundaries (i.e. in a geozone).

If the result of step 906 is "Yes", meaning that the current location of the freight container (or other device) is within the boundaries of the geofence (i.e. within a geozone or subregion), the method checks to see if the previous location inside the geofence boundaries (geozone or subregion) was the same, as indicated by a geofence ID, a comparison shown at 914. If both the previous geofence ID and the current geofence ID are the same, meaning that the freight container (or other device) has stayed in the same location (geozone or subregion) inside the geofence boundaries, the method goes back to step 904 and determines the current location. The method will loop through 904, 906, and 914 until the freight container (or other device) moves to a different geofence ID (i.e. geozone or subregion).

If the result of the comparison in step 914 determines that the geofence ID has changed (a "No" in step 914), the method then determines whether the previous location was a different geofence ID, which would indicate that the freight container (or other device) has moved from one location within the geofence boundaries (one geozone or subregion) to another location within the geofence boundaries, a comparison shown at step 916. If the result of the comparison in step 916 is "No", it means that the freight container (or other device) was previously outside of the geofence boundaries and is now inside of these boundaries (now inside the geozone). If that is the case, a report is sent to the server (or other electronic information receiving apparatus external to this process) to indicate that the freight container (or other device) has entered the geofence boundaries (i.e. geozone or subregion), a step shown at 918. The previous location is then set to the current geofence ID (i.e. location within the geozone) at step 920 and the process then goes back to step 904 to determine the current location.

If the result of the comparison in step 916 is "Yes", it means that the freight container (or other device) was previously inside of the geofence boundaries and is now also inside of these boundaries (now inside the geozone), but has moved from one location (geozone or subregion) to another location (geozone or subregion) within the geofence boundaries. If that is the case, a report is sent to the server (or other electronic information receiving apparatus external to this process) to indicate that the freight container (or other device) has moved, a step shown at 922. The previous location is then set to the current geofence ID (i.e. location within the geozone) at step 920 and the process then goes back to step 904 to determine the current location.

4. Additional Features and Fields of Use

The systems and methods described herein can be used in a variety of applications, including but not limited to:
(a) Monitoring of freight containers in a rail yard;
(b) Monitoring of freight containers on a ship or at a dock;
(c) Monitoring of truck trailers;
(d) Monitoring of delivery trucks;
(e) Monitoring of sealed air cargo containers;
(f) Collecting and forwarding sensor data in a smart chassis configuration;
(g) Acting as a communications node in a yard or traffic environment;
(h) Providing situation awareness in trucks operating in an autonomous driving mode; and
(i) Providing cargo and route information for customs and border control.

A number of variations and modifications of the disclosed embodiments can also be used. While the principles of the disclosure have been described above in connection with specific apparatuses and methods, it is to be clearly understood that this description is made only by way of example and not as limitation on the scope of the disclosure.

What is claimed is:
1. A freight tracking system, wherein:
the freight tracking system comprises:
a tracking device configured to be hidden in a taillight of a vehicle; and
a remote device configured for attachment to the vehicle at a location separate from the taillight, wherein the remote device location is proximate to or inside of a rear marker light of the vehicle;
the remote device comprises a remote device global navigation satellite system antenna and a remote device mesh networking antenna;
the remote device global navigation satellite system antenna is configured for receiving electromagnetic signals at a frequency of 1575.42 MHz;
the remote device mesh networking antenna is configured for:
sending and receiving electromagnetic signals at frequencies in the range of 2400 MHz to 2500 MHz; and
communicating position information to the tracking device;
the tracking device is configured for receiving electrical power from the vehicle;
the tracking device comprises a tracking device mesh networking antenna wherein the tracking device mesh networking antenna:
is configured for sending and receiving electromagnetic signals at frequencies in the range of 2400 MHz to 2500 MHz;
is located on an edge of a printed circuit board assembly configured to be hidden in the taillight of the vehicle;
is located on a ground plane of the printed circuit board assembly;
the tracking device comprises a cellular communication antenna wherein the cellular communications antenna:
is configured for sending and receiving electromagnetic signals at frequencies in the range of 824 to 960 MHz and 1700 to 2170 MHz;
is located on an edge of the printed circuit board assembly that is separate from the edge of the printed circuit board assembly where the mesh networking antenna is located;
is located on a ground plane of the printed circuit board assembly that is separate from the ground plane where the mesh networking antenna is located; and
is oriented in parallel with the mesh networking antenna;
the tracking device comprises a first position-finding module configured for determining a first position for the vehicle in response to information received by the remote device global navigation satellite system antenna;

the tracking device comprises an inertial measurement component for determining accelerations in three mutually-perpendicular axes wherein:
  the inertial measurement component further comprises a 3-axis accelerometer, a 3-axis gyroscope, and a 3-axis magnetometer; and
  the determination of inertial information comprises the use of an electronic fusion filter wherein:
    the electronic fusion filter is selected from the group of a Kalman filter, a Madgwick filter, and a Mahony filter; and
    the electronic fusion filter calculation comprises an arithmetic computation of a plurality of digital quaternions, wherein the quaternions further comprise a four-dimensional vector;
the tracking device comprises a tampering sensor configured for determining tampering information in response to an attempt made to open the tracking device;
the tracking device is configured to generate a tampering alarm signal in response to the tampering information;
the tracking device comprises a non-volatile electronic memory configured for storing:
  geographic boundary information comprising:
    an identifier field;
    a geozone type field;
    a center point latitude;
    a center point longitude; and
    a geozone radius;
  first position information for the vehicle wherein the first position information is responsive to the first position-finding module and the first position information further comprises time information; and
  the tampering information wherein the tampering information further comprises time information;
the tracking device is configured for:
  determining whether the first position information indicates that the vehicle is outside a region defined by the geographic boundary information; and
  initiating a geofencing alarm signal when the first position information indicates that the vehicle is outside of the geographic boundary region;
the tracking device comprises a first cellular wireless transmitter comprising a first subscriber identity module wherein the first cellular wireless communication transmitter is configured for sending:
  the geofencing alarm signal;
  the first position information; and
  the tampering alarm signal;
to an internet-connected database.

2. The freight tracking system of claim 1, wherein:
the freight tracking system further comprises the vehicle;
the tracking device further comprises a light monitoring circuit configured for determining whether the vehicle taillight is burning in response to a measurement of electric current;
the tracking device further comprises a rechargeable battery and a battery charger wherein the rechargeable battery is configured to be charged from the vehicle electrical power;
the tracking device further comprises a non-rechargeable high-capacity battery;
the tracking device further comprises a switching circuit configured for determining whether electrical power for the tracking device should come from the vehicle power, the rechargeable battery, or the non-rechargeable battery;
the tracking device further comprises a first processor configured for low power consumption wherein the first processor is configured for continuous operation;
the tracking device further comprises a second processor configured:
  to be awoken by the first processor when high-speed computations need to be made; and
  to sleep when not needed;
the tracking device further comprises a tracking device global navigation satellite system antenna wherein the tracking device global navigation satellite system antenna:
  is configured for receiving electromagnetic signals at a frequency of 1575.42 MHz;
  is located on an edge of the printed circuit board assembly;
  is located on a ground plane of the printed circuit board assembly that is separate from the ground plane where the mesh networking antenna is located and separate from the ground plane where the cellular communications antenna is located;
  is oriented orthogonally from the mesh networking antenna and orthogonally from the cellular communication antenna; and
  comprises an omnidirectional loop antenna;
the mesh networking antenna comprises small antenna segments that are oriented at angles or arcs to each other and connected at their ends to create a folded line that never loops having a total length of approximately 30 mm;
the cellular communication antenna comprises a ceramic surface mount antenna approximately 35 millimeters in length;
the tracking device comprises an environmental measurement component for determining environmental information wherein:
  the environmental measurement component comprises a temperature sensor;
  the environmental information comprises temperature information;
the tracking device further comprises a second position-finding module configured for determining a second position for the vehicle using dead reckoning in response to a previous position of the vehicle, the elapsed time, and velocity information generated in response to the inertial measurement component;
the tracking device further comprises a supplemental position-finding module configured for determining a supplemental position for the vehicle using information gathered from radio transmissions sent to or received from terrestrial-based transmitters in known locations using a technique selected from the group of:
  multilateration;
  trilateration timing;
  triangulation;
  relative transmission power level measurement;
  receiving Cell ID information;
  angular direction determination from an antenna pattern; and
  antenna phase discrimination;
the non-volatile electronic memory is further configured for storing second position information for the vehicle wherein the second position information is responsive to the second position-finding module and the second position information further comprises time information;

the tracking device is further configured for:
   determining whether the second position information indicates that the vehicle is outside the geographic boundaries; and
   initiating a geofencing alarm signal when the second position information indicates that the vehicle is outside of the geographic boundaries;
the non-volatile electronic memory is further configured for storing supplemental position information for the vehicle wherein the supplemental position information is responsive to the supplemental position-finding module and the supplemental position information further comprises time information;
the tracking device is further configured for:
   determining whether the vehicle is outside the geographic boundaries in response to the supplemental position information; and
   initiating a geofencing alarm signal when the supplemental information indicates that the vehicle is outside of the geographic boundaries;
the tracking device further comprises a short-range module configured for communicating with the vehicle wherein the short-range module can be configured for receiving vehicle information comprising:
   vehicle speed information received from a speedometer in the vehicle; and
   tire pressure information received from a tire pressure sensor in the vehicle; and
   the short-range module is configured for communicating between the tracking device and the vehicle;
the non-volatile electronic memory is further configured for storing:
   the vehicle speed information wherein the vehicle speed information further comprises time information;
   the tire pressure information wherein the tire pressure information further comprises time information;
the non-volatile electronic memory is configured for storing the geofencing alarm signal, the first position information, the environmental information, the tampering alarm signal, the vehicle speed information, and the tire pressure information in an encrypted format;
the first cellular wireless transmitter is further configured for sending the vehicle speed information and the tire pressure information; and
the tracking device comprises a second cellular wireless transmitter comprising a second subscriber identity module wherein the second wireless communication transmitter is configured for sending:
   the geofencing alarm signal;
   the first position information;
   the environmental information;
   the tampering alarm signal;
   the vehicle speed information; and
   the tire pressure information;
   to the internet-connected database when the first cellular wireless transmitter is unable to transmit data.

3. The freight tracking system of claim 1, wherein:
the tracking device further comprises a first processor configured for low power consumption wherein the first processor is configured for continuous operation; and
the tracking device further comprises a second processor configured:
   to be awoken by the first processor when high-speed computations need to be made; and
   to sleep when not needed.

4. The freight tracking system of claim 1, wherein:
the tracking device further comprises a second position-finding module configured for determining a second position for the vehicle using dead reckoning in response to a previous position of the vehicle, the elapsed time, and velocity information generated in response to the inertial measurement component;
the non-volatile electronic memory is further configured for storing second position information for the vehicle wherein the second position information is responsive to the second position-finding module and the second position information further comprises time information; and
the tracking device is further configured for:
   determining whether the second position information indicates that the vehicle is outside the geographic boundaries; and
   initiating a geofencing alarm signal when the second position information indicates that the vehicle is outside of the geographic boundaries.

5. The freight tracking system of claim 1, wherein:
the tracking device further comprises a supplemental position-finding module configured for determining a supplemental position for the vehicle using information gathered from radio transmissions sent to or received from terrestrial-based transmitters in known locations using a technique selected from the group of:
   multilateration;
   trilateration timing;
   triangulation;
   relative transmission power level measurement;
   receiving Cell ID information;
   angular direction determination from an antenna pattern; and
   antenna phase discrimination;
the non-volatile electronic memory is further configured for storing supplemental position information for the vehicle wherein the supplemental position information is responsive to the supplemental position-finding module and the supplemental position information further comprises time information; and
the tracking device is further configured for:
   determining whether the vehicle is outside the geographic boundaries in response to the supplemental position information; and
   initiating a geofencing alarm signal when the supplemental information indicates that the vehicle is outside of the geographic boundaries.

6. The freight tracking system of claim 1, wherein:
the tracking device further comprises a short-range communication module configured for communicating with the vehicle wherein the short-range module is configured for communicating between the tracking device and the vehicle using a Bluetooth communication protocol.

7. The freight tracking system of claim 1, wherein:
the tracking device comprises a second cellular wireless transmitter comprising a second subscriber identity module wherein the second wireless communication transmitter is configured for sending:
   the geofencing alarm signal;
   the first position information;
   the environmental information;
   the tampering alarm signal; and
   to the internet-connected database when the first cellular wireless transmitter is unable to transmit data.

8. The freight tracking system of claim 1, wherein:
the tracking device is configured for communicating with external devices wherein the external devices comprise:
at least one external device configured for hiding in the tail light of a second vehicle; and
at least one lock that comprises a communication module;
the communication between the tracking device and the external devices comprises wireless mesh communication using a protocol selected from the group of a WiFi protocol, a Zigbee protocol, and an Xbee protocol.

9. The freight tracking system of claim 1, wherein:
the tracking device is configured for wireless communication with a lock on the vehicle;
the lock is configured for attachment to a movable freight container;
the lock comprises a mechanical module and an electronic module;
the mechanical module comprises a lock mechanism configured for mechanical movement from an unlocked position to a locked position;
the electronic module comprises a shaft configured for insertion and secure retention into the mechanical module;
the mechanical module comprises a first magnet;
the electronic module comprises a first magnetic sensor and a second magnetic sensor;
the first sensor is positioned in the shaft at a location wherein:
the first sensor is responsive to the first magnet for at least part of the insertion path of the shaft portion into the cavity;
the first sensor is not responsive to the first magnet when the shaft portion is positioned for secure retention by the lock mechanism;
the second field sensor is positioned in the shaft in a location wherein the second sensor is responsive to the first magnet when the shaft portion is positioned for secure retention by the lock mechanism;
the electronic module is configured for generating magnetic field alarm information if the electronic module detects an unexpected interruption in a signal selected from the group of a first magnetic sensor signal and a second magnetic sensor signal;
the wireless communication component is configured for wirelessly transmitting the magnetic field alarm information to the tracking device; and
the tracking device is configured for transmitting the magnetic field alarm information to the internet-connected database.

10. The freight tracking system of claim 1, wherein:
the freight tracking system further comprises a lock on the vehicle;
the lock is configured for attachment to a movable freight container;
the tracking device comprises a short-range wireless communication module configured for sending and receiving data;
the lock comprises a short-range wireless communication module configured for sending data to the tracking device short-range wireless communication module and receiving data from the tracking device short range-wireless communication module;
the lock comprises a mechanical module and an electronic module;
the mechanical module comprises a lock mechanism configured for mechanical movement from an unlocked position to a locked position;
the electronic module comprises a shaft configured for insertion and secure retention into the mechanical module;
the mechanical module comprises a first magnet;
the electronic module comprises a first magnetic sensor and a second magnetic sensor;
the first sensor is positioned in the shaft at a location wherein:
the first sensor is responsive to the first magnet for at least part of the insertion path of the shaft portion into the cavity;
the first sensor is not responsive to the first magnet when the shaft portion is positioned for secure retention by the lock mechanism;
the second field sensor is positioned in the shaft in a location wherein the second sensor is responsive to the first magnet when the shaft portion is positioned for secure retention by the lock mechanism;
the electronic module is configured for generating magnetic field alarm information if the electronic module detects an unexpected interruption in a signal selected from the group of a first magnetic sensor signal and a second magnetic sensor signal;
the wireless communication component is configured for wirelessly transmitting the magnetic field alarm information to the tracking device; and
the tracking device is configured for transmitting the magnetic field alarm information to the internet-connected database.

11. The freight tracking system of claim 1, wherein:
the tracking device further comprises a light monitoring circuit configured for determining whether the vehicle taillight is burning by measuring whether the vehicle taillight in drawing electrical current;
the tracking device further comprises a rechargeable battery and a battery charger wherein the rechargeable battery is configured to be charged from the vehicle electrical power;
the tracking device further comprises a non-rechargeable high-capacity battery; and
the tracking device further comprises a switching circuit configured for determining whether electrical power for the tracking device should come the vehicle power, the rechargeable battery, or the non-rechargeable battery.

12. The freight tracking system of claim 1, wherein:
the non-volatile electronic memory is configured for storing information in an encrypted format; and
the first cellular wireless transmitter is configured for sending and receiving information in an encrypted format.

13. The freight tracking system of claim 1, wherein:
the tracking device comprises a tracking device global navigation satellite system antenna wherein the tracking device global navigation satellite system antenna:
is configured for receiving electromagnetic signals at a frequency of 1575.42 MHz;
is located on an edge of the printed circuit board assembly;
is located on a ground plane of the printed circuit board assembly that is separate from the ground plane where the mesh networking antenna is located and separate from the ground plane where the cellular communications antenna is located; and is oriented orthogonally from the mesh networking antenna and orthogonally from the cellular communication antenna.

14. The freight tracking system of claim 1, wherein:
the inertial measurement component is used to measure vibration information;
the non-volatile electronic memory is further configured for storing the vibration information;
the first cellular wireless transmitter is further configured for transmitting the vibration information to the internet-connected database.

15. A freight tracking device, wherein:
the freight tracking device is configured to be hidden in a taillight of a vehicle;
the freight tracking device is configured to receive electrical power from the vehicle;
the freight tracking device is configured to receive vehicle position information wirelessly from a second device wherein the second device:
  is located on the vehicle at a at a location that is proximate to or inside of a rear marker light of the vehicle;
  is configured to determine the vehicle position in response to signals from a global navigation satellite system; and
  the second device is configured to receive the global navigation satellite system signals at a frequency of 1575.42 MHz;
the freight tracking device is configured to communicate wirelessly with the second device using a wireless mesh network operating at a frequency between 2400 MHz and 2500 MHz;
the freight tracking device comprises an inertial measurement component comprising a 3-axis accelerometer, a 3-axis gyroscope, and a 3-axis magnetometer;
the inertial measurement component is configured for determining inertial information by using:
  a fusion filter selected from the group of a Kalman filter, a Madgwick filter, and a Mahony filter;
the freight tracking device comprises a non-volatile electronic memory configured for storing:
  geographic boundary information;
  the vehicle position information; and
  time information
the freight tracking device is configured for generating a vehicle position alarm signal in response to a comparison of the geographic fence boundary information and the vehicle position information; and
the freight tracking device comprises a first cellular wireless transmitter comprising a first subscriber identity module configured for sending:
  the vehicle position alarm signal;
  the vehicle position information; and
  time information.

16. The freight tracking device of claim 15, wherein:
the inertial measurement component is configured for determining inertial information by using a fusion filter calculation that comprises the computation of a plurality of digital quaternions, wherein the quaternions further comprise a four-dimensional vector;
the freight tracking device further comprises a tampering sensor configured for determining tampering information in response to an attempt made to open the freight tracking device;
the freight tracking device is configured to generate a tampering alarm signal in response to the tampering information;
the geographic boundary information comprises:
  an identifier field;
  a geozone type field;
  a center point latitude;
  a center point longitude; and
  a geozone radius;
the first cellular wireless transmitter is configured to communicate at frequencies in the range of 824 to 960 MHz and 1700 to 2170 MHz;
the first cellular wireless transmitter is configured to communicate:
  the vehicle position alarm signal;
  the vehicle position information;
  the tampering alarm signal; and
  time information;
to an internet-connected database.

17. The freight tracking device of claim 15, wherein:
the freight tracking device is configured for short-range wireless communication with a lock on the vehicle using a wireless mesh network operating at a frequency between 2400 MHz and 2500 MHz.

18. The freight tracking device of claim 15, wherein:
the freight tracking device further comprises a short-range communication module configured for communicating with the vehicle using a Bluetooth communication protocol; and
the tracking device further comprises a second position-finding module configured for determining a second position for the vehicle using dead reckoning in response to a previous position of the vehicle, the elapsed time, and velocity information generated in response to the inertial measurement component.

19. The freight tracking device of claim 15, wherein:
the tracking device further comprises a light monitoring circuit configured for determining whether the vehicle taillight is burning by measuring whether the vehicle taillight in drawing electrical current; and
the tracking device further comprises a supplemental position-finding module configured for determining a supplemental position for the vehicle using information gathered from radio transmissions sent to or received from terrestrial-based transmitters in known locations using a technique selected from the group of:
  multilateration;
  trilateration timing;
  triangulation;
  relative transmission power level measurement;
  receiving Cell ID information;
  angular direction determination from an antenna pattern; and
  antenna phase discrimination.

20. A method for tracking freight comprising the steps of:
establishing a position finding device wherein the position finding device comprises a global navigation satellite system receiver and a wireless mesh network transmitter;
establishing a taillight device wherein the taillight device comprises:
  a wireless mesh network transmitter;
  an inertial measurement component further comprising a 3-axis accelerometer, a 3-axis gyroscope, and a 3-axis magnetometer;
  a tampering sensor;
  a non-volatile memory;
  a processor; and
  a cellular wireless transmitter comprising a subscriber identity module;

hiding the taillight device in the taillight of a vehicle wherein hiding further comprises receiving electrical power from the vehicle;

attaching the position finding device to a location on the vehicle that is different from the location of the taillight of the vehicle that contains the taillight device, wherein the position finding device is further located proximate to or inside of a rear marker light of the vehicle;

using the global navigation satellite system receiver to determine vehicle position information in response to signals from a plurality of satellites;

communicating the vehicle position information from the position finding device to the taillight device using the wireless mesh network transmitters in the position finding device and the taillight device;

using the taillight device processor to compare the vehicle position information with geographic fence boundaries to determine if the vehicle is within the geographic fence boundaries;

generating vehicle position alarm information if the position of the vehicle is not within the geographic fence boundaries;

using the inertial measurement component, a filter selected from the group of a Kalman filter, a Madgwick filter, and a Mahony filter and a calculation comprising a plurality of digital quaternions to determine inertial information, wherein the quaternions further comprise a four-dimensional vector;

generating tampering alarm information in response to the tampering sensor storing:
  the vehicle position alarm information;
  the tampering alarm information; and
  time information;
  in non-volatile memory; and using the cellular wireless transmitter to communicate:
  the vehicle position alarm signal;
  the vehicle position information;
  the tampering alarm signal; and
  time information.

* * * * *